(12) United States Patent
Kim et al.

(10) Patent No.: US 9,595,341 B2
(45) Date of Patent: Mar. 14, 2017

(54) MEMORY SYSTEM TO DETERMINE INTERFERENCE OF A MEMORY CELL BY ADJACENT MEMORY CELLS, AND OPERATING METHOD THEREOF

(71) Applicant: SAMSUNG Electronics Co., Ltd., Suwon-si, Gyeonggi-do (KR)

(72) Inventors: Jaehong Kim, Seoul (KR); Kijun Lee, Seoul (KR); Yong June Kim, Seoul (KR); Heeseok Eun, Hwaseong-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/196,366

(22) Filed: Mar. 4, 2014

(65) Prior Publication Data
US 2014/0185375 A1   Jul. 3, 2014

Related U.S. Application Data

(63) Continuation-in-part of application No. 14/068,143, filed on Oct. 31, 2013, which is a continuation of application No. 13/016,063, filed on Jan. 28, 2011, now Pat. No. 8,587,997.

(30) Foreign Application Priority Data

Mar. 2, 2010   (KR) .................. 10-2010-0018660

(51) Int. Cl.
G11C 16/04     (2006.01)
G11C 16/34     (2006.01)
G06F 12/02     (2006.01)
G11C 16/26     (2006.01)
G11C 11/56     (2006.01)

(52) U.S. Cl.
CPC ...... G11C 16/3431 (2013.01); G06F 12/0238 (2013.01); G11C 11/5642 (2013.01); G11C 16/26 (2013.01); G11C 16/3427 (2013.01)

(58) Field of Classification Search
CPC . G11C 16/3431; G11C 11/5642; G11C 16/26; G11C 16/3427; G11C 12/0238
USPC ............. 365/185.02, 185.03, 185.09, 185.33
See application file for complete search history.

(56) References Cited

U.S. PATENT DOCUMENTS 5,657,332 A     8/1997    Auclair et al.
6,879,520 B2    4/2005    Hosono et al.
7,453,723 B2    11/2008   Radke
8,587,997 B2 *  11/2013   Kim et al. ............... 365/185.02

(Continued)

FOREIGN PATENT DOCUMENTS

JP   2008-108356    5/2008
KR   20040091583   10/2004

(Continued)

Primary Examiner — Gene Auduong
(74) Attorney, Agent, or Firm — Muir Patent Law, PLLC

(57) ABSTRACT

Provided are a memory system and an operating method thereof. The operating method reads an observation memory cell at least one time with different read voltages to configure a first read data symbol, reads a plurality of interference memory cells adjacent to the observation memory cell at least one time with different read voltages to configure second read data symbols, and determines a logical value of the observation memory cell based on the first read data symbol and the second read data symbols.

20 Claims, 19 Drawing Sheets

(56) References Cited

U.S. PATENT DOCUMENTS

| | | | |
|---|---|---|---|
| 8,958,243 B2* | 2/2015 | Zeng et al. | 365/185.02 |
| 2008/0158973 A1 | 7/2008 | Mui | |
| 2009/0067276 A1 | 3/2009 | Pekny | |
| 2014/0056064 A1* | 2/2014 | Kim et al. | 365/185.02 |

FOREIGN PATENT DOCUMENTS

| | | |
|---|---|---|
| KR | 1020080016543 | 2/2008 |
| KR | 1020080052288 | 6/2008 |

* cited by examiner

FIG. 4

|     | Read Data Symbol | 3-Bit-Symbol |
|-----|------------------|--------------|
| VA1 | 1111111          | 111          |
| VA2 | 0111111          | 110          |
| VA3 | 0011111          | 101          |
| VA4 | 0001111          | 100          |
| VA5 | 0000111          | 011          |
| VA6 | 0000011          | 010          |
| VA7 | 0000001          | 001          |
| VA8 | 0000000          | 000          | ions. # MEMORY SYSTEM TO DETERMINE INTERFERENCE OF A MEMORY CELL BY ADJACENT MEMORY CELLS, AND OPERATING METHOD THEREOF

CROSS-REFERENCE TO RELATED APPLICATIONS

This application is a continuation-in-part of U.S. patent application Ser. No. 14/068,143, filed Oct. 31, 2013, which is a continuation of U.S. patent application Ser. No. 13/016,063, filed Jan. 28, 2011(U.S. Pat. No. 8,587,997), which claims priority under 35 U.S.C. §119(a) from Korean Patent Application No. 10-2010-0018660, filed on Mar. 2, 2010, the entire contents of which are hereby incorporated by reference.

BACKGROUND

1. Field of the Invention

The present general inventive concept disclosed herein relates to a semiconductor memory device, and more particularly, to a memory system including nonvolatile memory device and an operating method thereof.

2. Description of the Related Art

A semiconductor memory device is a micro electronic device most necessary for digital logic designs that include computers that have a microprocessor, with applications ranging from satellites to consumer electronic technologies. A semiconductor memory device is largely divided into a volatile semiconductor memory device and a nonvolatile semiconductor memory device. The nonvolatile semiconductor memory device may store data even when a power source is shut off. Data stored in nonvolatile memories may be semipermanent or reprogrammed according to memory manufacturing technologies. The nonvolatile semiconductor memory device is used for storing programs and micro codes in a wide range of applications such as computers, avionics, communication, and consumer electronic technologies.

As a representative example of a nonvolatile memory device, there is a flash memory device. Recently, as the high integration of memory devices is increasingly required, multi-bit memory devices are being generalized which store multi-bits in one memory cell. In the memory cells of a multi-bit flash memory device, the interval between threshold voltage distributions should be densely controlled. Also, technologies are being researched for improving a degree of integration for increasing the number of memory cells per unit area in order to meet high-capacity requirements.

SUMMARY

However, the above-described high capacity memory devices may have decreased reliability of data that are stored in memory cells. For solving this, technology is urgently required to realize the high capacity of nonvolatile memory devices and enhance the reliability of the nonvolatile memory devices.

Exemplary embodiments of the present general inventive concept provide a memory system and an operating method thereof to minimize prevent a read error due to the difference of interference the memory cells of a nonvolatile memory device receive from peripheral memory cells.

Additional features and utilities of the present general inventive concept will be set forth in part in the description which follows and, in part, will be obvious from the description, or may be learned by practice of the present general inventive concept.

Exemplary embodiments of the present general inventive concept may provide an operating method of a memory system, which includes a nonvolatile memory device, including reading an observation memory cell at least one time with different read voltages to configure a first read data symbol, reading a plurality of interference memory cells adjacent to the observation memory cell at least one time with different read voltages to configure a second read data symbol, and determining a logical value of the observation memory cell, based on the first and second read data symbols.

In exemplary embodiments of the present general inventive concept, the determining of a logical value may include changing the first read data symbol into a first bit symbol, changing the second read data symbol into a second bit symbol, and comparing the first and second bit symbols to determine the logical value of the observation memory cell.

In exemplary embodiments of the present general inventive concept, the comparing of the first and second bit symbols may include comparing the first and second bit symbols to calculate an interference that the observation memory cell receives, and determining the logical value of the observation memory cell according to at least the first bit symbol and the calculated interference.

In exemplary embodiments of the present general inventive concept, the determining of the logical value may include calculating a likelihood ratio according to at least the first bit symbol and the calculated interference, and determining the logical value of the observation memory cell according to at least the calculated likelihood ratio.

In exemplary embodiments of the repent general inventive concept, the configuring of a second read data symbol may include reading interference memory cells, which share a word line with the observation memory cell, at least one time with different read voltages to configure the second read data symbols of the interference memory cells.

In exemplary embodiments of the present general inventive concept, the configuring of a first read data symbol and the configuring of a second read data symbol may be performed together.

In exemplary embodiments of the present general inventive concept, the configuring of a second read data symbol may include reading interference memory cells, which share an unselected word line adjacent to a word line of the observation memory cell, at least one time with different read voltages to configure the second read data symbols of the interference memory cells.

In exemplary embodiments of the present general inventive concept, a memory system can include a nonvolatile memory device including an observation memory cell and a plurality of interference memory cells adjacent to the observation memory cell, and a controller to control the nonvolatile memory device, where the nonvolatile memory device includes a reading/writing circuit to read the observation memory cell and the interference memory cells at least one time with different read voltages, and the controller includes a first data buffer unit to store a first read data symbol which is configured with data of the read observation memory cell, a second data buffer unit to store second read data symbols which are respectively configured with data of the read interference memory cells, and a determination unit to determine a logical value of the observation memory cell, based on the first and second read data symbols.

In exemplary embodiments of the present general inventive concept, the interference memory cells may include adjacent memory cells to share a word line with the observation memory cell.

In exemplary embodiments of the present general inventive concept, the interference memory cells may include adjacent memory cells to share a word line with the observation memory cell, and adjacent memory cells that do not share the word line with the observation memory cell.

In exemplary embodiments of the present general inventive concept, the determination unit may include a first bit symbol converter to receive the first read data symbol stored in the first data buffer unit, and to convert the first read data symbol into a first bit symbol, and a second bit symbol converter to receive the second read data symbol stored in the second data buffer unit, and to convert the second read data symbol into a second bit symbol, and the determination unit to compare the first and second bit symbols to determine the logical value of the observation memory cell.

In exemplary embodiments of the present general inventive concept, the determination unit may further include an interference calculation unit to compare the first and second bit symbols to calculate an interference that the observation memory cell receives, and the determination unit may determine the logical value of the observation memory cell according to at least the first bit symbol and the calculated interference.

In exemplary embodiments of the present general inventive concept, the determination unit may further include a likelihood ratio calculation unit to calculate a likelihood ratio of the observation memory cell on the basis of the first bit symbol and the calculated interference; and an Error Correction Code (ECC) decoder to receive the calculated likelihood ratio, and determining the logical value of the observation memory cell according to at least the calculated likelihood ratio.

The nonvolatile memory device and the controller may configure a semiconductor drive (e.g., a Solid State Drive (SSD)).

The nonvolatile memory device and the controller may configure a memory card.

Exemplary embodiments of the present general inventive concept also provide a method of operating a memory system including at least one nonvolatile memory device, the method including receiving data from at least one memory cell of a selected word line of the nonvolatile memory device, determining a first read data symbol, and storing the first read data symbol in a first data buffer, receiving data from memory cells of an unselected word line of the nonvolatile memory device that are adjacent to the at least one memory cell of the selected word line, and storing the received data in a second data buffer, and determining the interference that a first memory cell of the at least one memory cell of a selected word line receives from the memory cells of the unselected word line.

The method may include where the interference is determined using threshold voltages, the directions, and the distances of the memory cells of the unselected word lines.

The method may include determining a likelihood ratio according to at least the first read data symbol and the determined interference.

The method may include determining a logical value stored in the first memory cell according to the determined likelihood ratio.

The method may include providing the determined logical value as read data when it is requested by a host that is communicatively coupled to the memory system.

BRIEF DESCRIPTION OF THE DRAWINGS

The above and/or other features and utilities of the present general inventive concept will become apparent and more readily appreciated from the following description of the exemplary embodiments, taken in conjunction with the accompanying drawings, in which:

FIG. 4 illustrates a 3-bit symbol corresponding to a read data symbol when first to seventh read voltages are sequentially applied according to exemplary embodiments of the present general inventive concept;

DETAILED DESCRIPTION OF THE EMBODIMENTS

Figure 1:
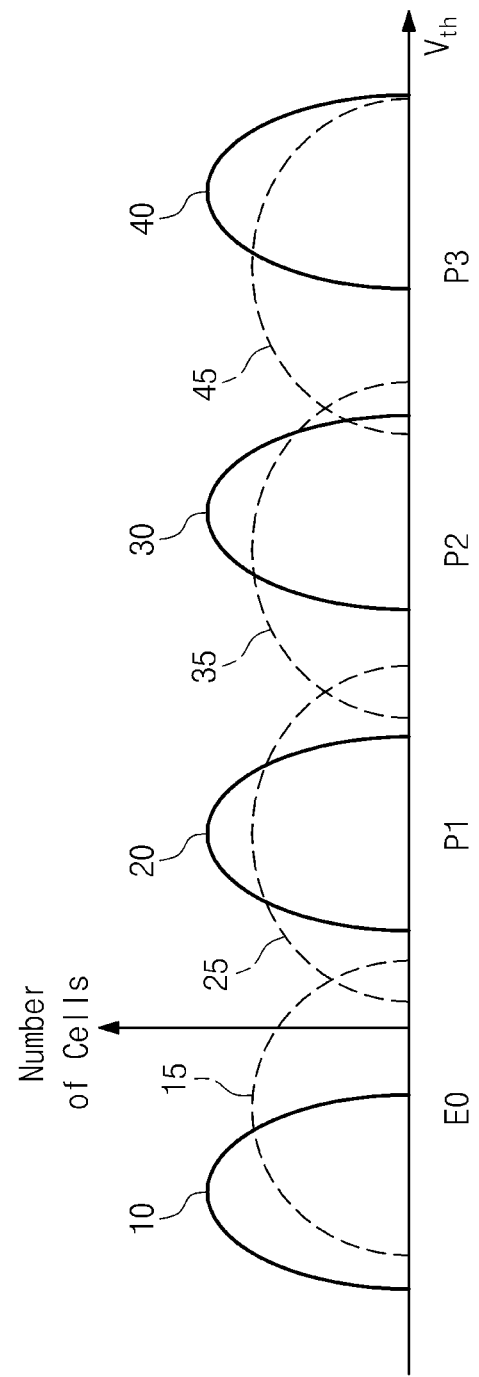
FIG. 1 is a diagram illustrating a threshold voltage dispersion of a multi-bit nonvolatile memory device including an error according to exemplary embodiments of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Hereinafter, a Solid State Drive (SSD) will be used as an example of a memory system to explain the features and functions of an embodiment of the inventive concept. However, other advantages and performances of exemplary embodiments of the present general inventive concept set forth herein will be readily understood by persons skilled in the art. Also, although a NAND flash memory is described as an example of a storage medium, embodiments of the inventive concept are not limited thereto. For example, memories such as Phase-change Random Access Memory (PRAM), Magnetoresistive Random Access Memory (MRAM), Resistive Random Access Memory (ReRAM), Ferroelectric Random Access Memory (FRAM) and NOR flash memory may be used as storage media. Furthermore, exemplary embodiments of the present general inventive concept may be applied to a memory system in which a plurality of memory devices may be included (e.g., a plurality of different memory devices may be mixed in a memory system).

The present general inventive concept may be embodied or applied through other embodiments. Besides, the detailed descriptions may be amended or modified according to viewpoints and applications without departing from the scope, technical idea and other utilities of the present general inventive concept.

FIG. 1 is a diagram illustrating a threshold voltage dispersion of a multi-bit nonvolatile memory device including an error. In FIG. 1, the threshold voltage dispersion of memory cells where 2 bits can be stored in one memory cell is exemplarily illustrated. In FIG. 1, the abscissa axis (i.e., the horizontal axis and/or x-axis) can indicate the threshold voltages (i.e., $V_{th}$) of memory cells, and the ordinate axis (i.e., the vertical and/or y-axis) can indicate the number of memory cells.

In a nonvolatile memory device, memory cells can be programmed into reference dispersions 10, 20, 30, and 40. The reference dispersions 10, 20, 30, and 40 may be spaced from one another, and may have different threshold voltages and number of cells. The reference dispersions 10, 20, 30, and 40 may be part of at least one erasing state and/or programming states of the nonvolatile memory device, as discussed in detail below. The reference dispersion 10 may correspond with an erasing state E0, and the reference dispersions 20, 30, and 40 may correspond with programming states P1, P2, and P3, respectively, as illustrated in FIG. 1. The threshold voltages of the memory cells may not maintain the shapes of the reference dispersions 10, 20, 30, and 40 because of various causes, examples of which are discussed below, and include interference from adjacent memory cells. The changes of the threshold voltages of the memory cells can cause a read error.

As an example of the change of a threshold voltage, an interference effect due to adjacent memory cells may be exemplified. As an example of the interference, there are F-Poly coupling and lateral charge spreading. F-Poly coupling may be a widening of a threshold voltage distribution because of a coupling between adjacent memory cells in a nonvolatile memory. In the nonvolatile memory cell, when adjacent memory cells have different threshold voltages, the memory cells may affect each other. For example, the threshold voltage of a memory cell may increase or decrease according to the threshold voltage of an adjacent memory cell like F-Poly coupling and lateral charge spreading. Particularly, F-Poly coupling and lateral charge spreading can measurably occur between a memory cell programmed into an erasing state E0 and a memory cell programmed into a programming state P3 having the highest threshold voltage among memory cells.

When a memory cell is initially programmed, the threshold voltages of memory cells can form the reference dispersions 10, 20, 30, and 40 that are illustrated in FIG. 1 as a solid line. The dispersion of memory cells corresponding to the reference dispersion 10 may move to a dispersion 15 according to F-Poly coupling or lateral charge spreading. Memory cells corresponding to the reference dispersion 40 may move to a dispersion 45 according to F-Poly coupling or lateral charge spreading. That is, the threshold voltages of memory cells programmed into the erasing state E0 may increase according to F-Poly coupling or lateral charge spreading. The threshold voltages of memory cells programmed into the programming state P3 may decrease by lateral charge spreading. As illustrated in FIG. 1, the memory cells corresponding to the reference dispersion 20 may move to a dispersion 25, and the memory cells corresponding to the reference dispersion 30 may move to a dispersion 35 according to, for example, F-Poly coupling or lateral charge spreading.

In the above description, the spreading of the threshold voltage dispersion of the nonvolatile memory device may cause a read error. However, a read error may occur by various causes in nonvolatile memory devices and storages. The read error may occur from interference between adjacent cells, a process defect, a signal interference by various external noises, a distortion by a stable channel, the decrease of an amount of charge based on the elapse of time, a programming disturbance (i.e., a disturbance that occurs during a programming operation and/or programming state, such as during programming states P1, P2, and/or P3), and a read disturbance (i.e., a disturbance that occurs during a read operation). Exemplary embodiments of the present general inventive concept disclosed herein provide a memory system and a data processing method which can increase and/or improve the reliability of originally-programmed data from the error.

Figure 2:
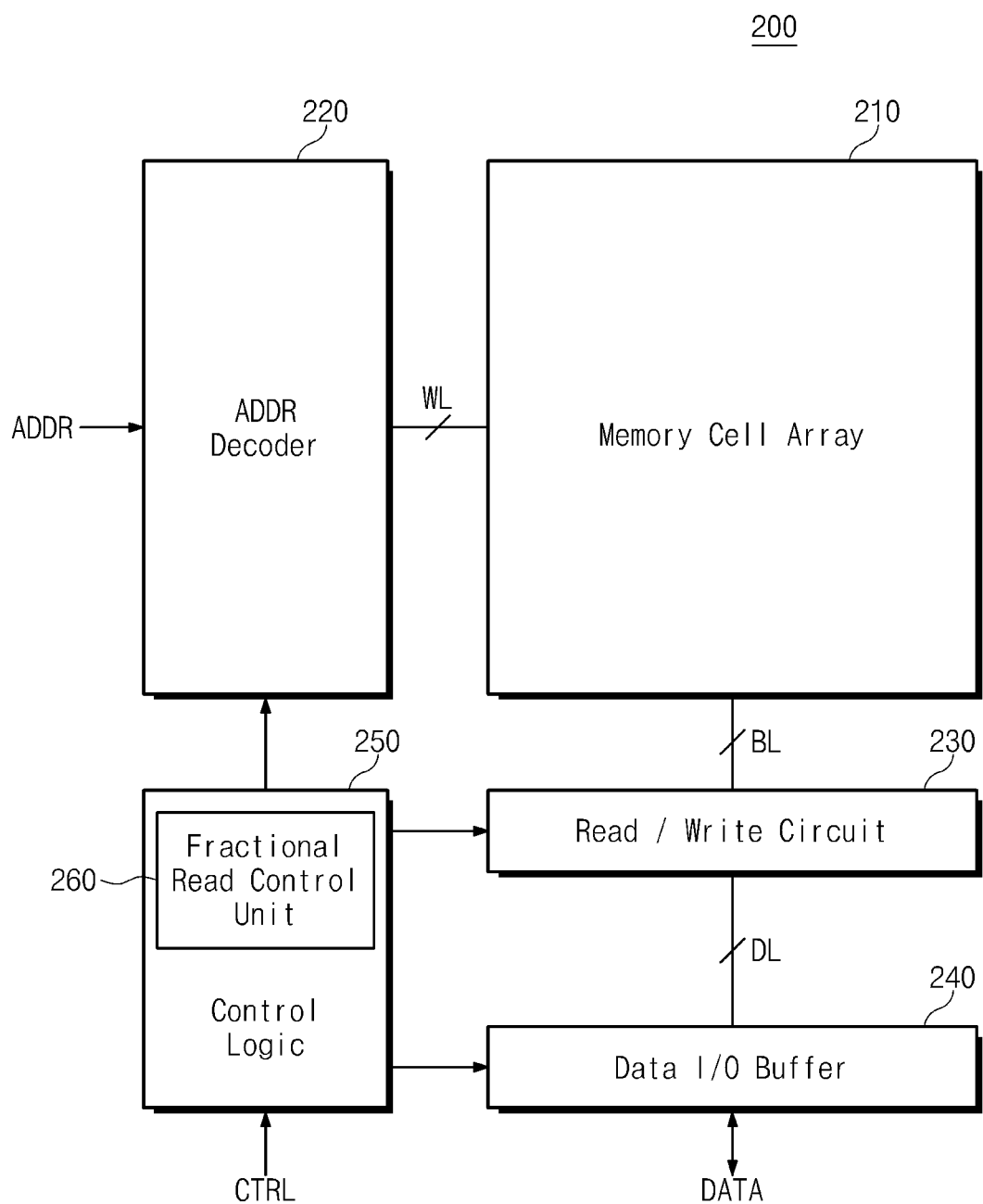
FIG. 2 is a block diagram illustrating a nonvolatile memory device according to exemplary embodiments of the present general inventive concept.

FIG. 2 is a block diagram illustrating a nonvolatile memory device 200 according to exemplary embodiments of the present general inventive concept.

Referring to FIG. 2, a nonvolatile memory device 200 according to exemplary embodiments of the present general inventive concept can include a memory cell array 210, an address decoder 220, a reading/writing circuit 230, a data input/output (I/O) circuit 240, a control logic 250, and a fractional read control unit 260.

The memory cell array 210 can be communicatively connected to the address decoder 220 through word lines WL, and can be communicatively connected to the reading/writing circuit 230 through bit lines BL. The memory cell array 210 can include a plurality of memory cells. Exemplarily, memory cells arranged in the row direction can be communicatively connected to the word lines WL. Memory cells arranged in the column direction are connected to the bit lines BL. Exemplarily, the memory cell array 210 may store one or more bits in each cell. The memory cell array 210 may be a semiconductor memory device having a plurality of memory cells, or may be a plurality of semiconductor memory devices communicatively coupled to one another.

The address decoder 220 can be communicatively connected to the memory cell array 210 through the word lines WL. The address decoder 220 can operate according to the control of the control logic 250. The address decoder 220 can receive an address ADDR from the outside (e.g., a host device such as a controller and/or processor that is communicatively coupled to the address decoder 200). The address decoder may be a semiconductor device, a programmable logic device, a field programmable gate array, application specific integrated circuit, or any other suitable semiconductor logic device to carry out the exemplary embodiments of the present general inventive concept disclosed herein.

The address decoder 220 can decode the block address of the received address ADDR. The address decoder 220 may activate one memory block or a plurality of memory blocks by using the decoded block address (e.g., the received address ADDR from the host device). The address decoder 220 can decode the row address of the received address ADDR. The address decoder 220 may select the word lines WL using the decoded row address. The address decoder 220 can decode the column address of the received address ADDR. The decoded column address can be transferred to the reading/writing circuit 230. Exemplarily, the address decoder may include a block decoder, a row decoder, a column decoder, and an address buffer.

The reading/writing circuit 230 can be communicatively connected to the memory cell array 210 through the bit lines BL, and can be communicatively connected to the data input/output circuit 240 through data lines DL. The reading/writing circuit 230 can operate according to the control of the control logic 250. That is, the reading/writing circuit 230 may receive one or more commands from the control logic 250, and may operate according to the one or more received commands. The reading/writing circuit 230 can receive the decoded column address from the address decoder 220. The reading/writing circuit 230 can select the bit lines BL using the decoded column address. The reading/writing circuit 230 may be a semiconductor device, a programmable logic device, a field programmable gate array, application specific integrated circuit, and/or any other suitable device to carry out the exemplary embodiments of the present general inventive concept disclosed herein.

The reading/writing circuit 230 can receive one page-size data or any other predetermined amount of data from the data input/output circuit 240, and the received data is programmed (e.g., simultaneously programmed) in a page selected in programming. The reading/writing circuit 230 can read page data selected in a reading operation, and can transfer the read data to the data input/output circuit 240. Exemplarily, the reading/writing circuit 230 may include a page buffer (and/or a page register, data buffer, and/or data register) and a column selecting circuit.

The data input/output circuit 240 can be communicatively connected to the reading/writing circuit 230 through the data lines DL. The data input/output circuit 240 can operate according to the control of the control logic 250. The data input/output circuit 240 can exchange data DATA with the outside (e.g., a host device, a controller, a microprocessor, and/or any other suitable device to carry out the exemplary embodiments of the present general inventive concept). The data input/output circuit 240 can transfer data, which is received from the outside (e.g., received from the host device), to the reading/writing circuit 230 through the data lines DL. The data input/output circuit 240 can output data, which may be transferred through the data lines DL from the reading/writing circuit 230, to the outside (e.g., to the host device). Exemplarily, the data input/output circuit 240 may include a data buffer. The data buffer may temporarily store data that is received by the data input/output circuit 240 from a host device before providing it to the reading/writing circuit 230 through the data lines DL, or that may temporarily store data that is received from the reading/writing circuit 230 to be output to the outside (e.g., to the host device).

Data transferred from the reading/writing circuit 230 may be output to the outside (e.g., to the host device) by one page unit and/or by a predetermined data size. The data transferred from the reading/writing circuit 230 may be stored in a buffer circuit (not illustrated) and be transmitted to the outside in packet units. A packet can include a plurality of pages (for example, one packet includes three pages). For example, the buffer circuit (not illustrated) may be the data input/output circuit 240. For example, the buffer circuit (not illustrated) may be a discrete circuit other than the data input/output circuit 240.

The control logic 250 can be communicatively connected to the address decoder 220, the reading/writing circuit 230, and the data input/output circuit 240. The control logic 250 can control the operation of the flash memory device 200. The control logic 250 may operate in response to a control signal CTRL transferred from the outside (e.g., from a host device, a controller, a microprocessor, etc.). The control logic 250 may be a programmable logic device, a field programmable gate array, application specific integrated circuit, a controller, a processor, or any other suitable device to carry out the exemplary embodiments of the present general inventive concept disclosed herein.

The control logic 250 can include the fractional read control unit 260. The fractional read control unit 260 can control the fractional reading operation of the nonvolatile memory device 200. That is, a fractional read control unit 260 can control a fractional read operation to read a selected memory cell a predetermined number of times and can configure a read data symbol. The fractional read control unit 460 can control a voltage to be applied to a selected memory cell. The function and/or operations of the fractional read control unit 260 will be described below in more detail with reference to FIGS. 2 and 3.

As an example, the fractional read control unit 260 may be a digital circuit, an analog circuit, or the combined circuit of the digital and analog circuits. As another example, the fractional read control circuit 260 may be implemented in the type of software driven in the control logic 250. As still another example, the fractional read control unit 260 may be a combination of hardware and software.

Figure 3:
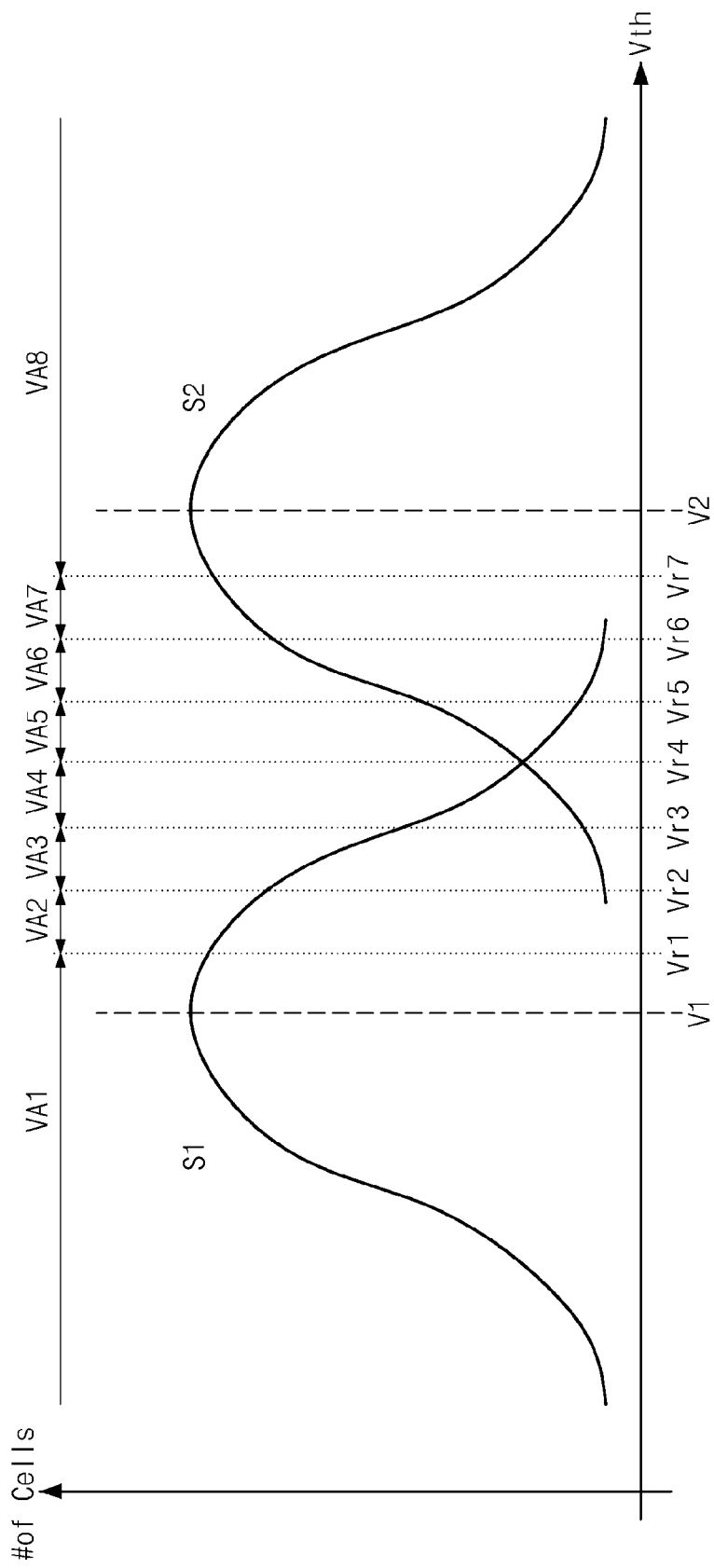
FIG. 3 is a diagram illustrating the threshold voltage dispersions of the memory cells of a memory cell array in FIG. 2.

FIG. 3 is a diagram illustrating the threshold voltage dispersions of the memory cells of the memory cell array

210 of FIG. 2. In FIG. 3, the abscissa axis (e.g., the horizontal axis and/or the x-axis) indicates the threshold voltages (e.g., threshold voltage $V_{th}$) of memory cells, and the ordinate axis (e.g., the vertical axis and/or y-axis) indicates the number of memory cells.

In FIG. 3, the first and second states S1 and S2 of the memory cells are illustrated. However, the memory cells are not limited to have the first and second states S1 and S2. The memory cells can store at least one bit in each cell. That is, the memory cells may have at least two states.

In FIG. 3, the threshold voltage dispersions (e.g., the threshold voltage dispersions of the first state S1 and the second state S2) of the memory cells are illustrated. However, the memory cells are not limited to storing data using a threshold voltage. If the memory cells store data using a resistance value, the abscissa axis of FIG. 3 may indicate the resistance values of the memory cells. That is, the resistance dispersion of the memory cells may be illustrated in FIG. 3.

As illustrated in FIG. 3 cells having the first state S1 are dispersed around a first voltage V1. Memory cells having the second state S2 are dispersed around a second voltage V2.

Hereinafter, it is assumed that memory cells that are disposed in the left (e.g., memory cells dispersed around the first voltage V1) with respect to first to seventh read voltages Vr1 to Vr7 correspond to a logic high 1, and memory cells that are disposed in the right (e.g., memory cells dispersed around the second voltage V2) with respect to the first to seventh read voltages Vr1 to Vr7 correspond to a logic low 0. However, exemplary embodiments of the present general inventive concept are not limited thereto. Exemplarily, the first and second states S1 and S2 may be applied to be in correspondence with 1 and 0, respectively.

Referring to FIGS. 2 and 3, the fractional read control unit 260 can control a fractional reading operation. In the fractional reading operation, the fractional read control unit 260 can control the reading/writing circuit 230 to read a selected memory cell at least one times. For example, the fractional read control unit 260 can control the reading/writing circuit 230 to perform i-bit fractional read. In i-bit fractional read, the reading/writing circuit 230 can read a selected memory cell a maximum of $(2^i)-1$ times. That is, the reading/writing circuit 230 can read a maximum of $(2^i)-1$ bits from one memory cell. A maximum of $(2^i)-1$ bits read from one memory cell can configure one symbol. Hereinafter, a symbol read from a selected memory cell is referred to as a read data symbol.

As an example, it is assumed that the fractional read control unit 260 can control the reading/writing circuit 230 for 3-bit fraction read to be performed. That is, a selected memory cell can be read a maximum of seven times (i.e., where i is the number of bits and i=3, and where $(2^3)-1=7$) in fractional read. However, the fractional read control unit 260 is not limited to control the reading/writing circuit 230 for 3-bit fractional read to be performed. That is, 2-bit, 4-bit, 8-bit, 16-bit, and/or any other suitable number of bits may be used in a fractional read operation.

In fractional read, the fractional read control unit 260 can control a read voltage applied to a selected memory cell to be controlled. For example, the first to seventh read voltages Vr1 to Vr7 applied to a selected memory cell in fractional read are illustrated in FIG. 3. In fractional read, the first to seventh read voltages Vr1 to Vr7 can be applied to a selected memory cell. Read data corresponding to the first to seventh read voltages Vr1 to Vr7 can configure a read data symbol.

For example, the first to seventh read voltages Vr1 to Vr7 may be sequentially applied to a selected memory cell. As an example, the first to seventh read voltages Vr1 to Vr7 may be applied to a selected memory cell in reverse order (that is, with voltage Vr7 being applied first, and with the voltages Vr6, Vr5, Vr4, Vr3, Vr2, and Vr1 subsequently applied to the selected memory cell).

A read data symbol that is obtained by applying the first to seventh read voltages Vr1 to Vr7 may correspond to 3-bit symbol. That is, a 3-bit symbol may be 3 bits, as the fractional read may be selected to be a 3 bit fractional read. The symbol bit number may correspond to the i-bit value that may be selected for the fractional read, as discussed above. For example, FIG. 4 illustrates a 3-bit symbol corresponding to a read data symbol when the first to seventh read voltages Vr1 to Vr7 are sequentially applied.

FIG. 4 illustrates a 3-bit symbol corresponding to a read data symbol when the first to seventh read voltages Vr1 to Vr7 are sequentially applied. In FIG. 4, the ordinate axis indicates the threshold voltage of a selected memory cell, and the abscissa axis indicates a read data symbol and a 3-bit symbol when the first to seventh read voltages Vr1 to Vr7 are sequentially applied.

It can be assumed that a selected memory cell has a threshold voltage corresponding to a first voltage area VA1. As illustrated in FIG. 3, the first voltage area VA1 corresponds to a lower level than the first read voltage Vr1. Therefore, when the first to seventh read voltages Vr1 to Vr7 are sequentially applied to a selected memory cell, the selected memory cell can be turned on. That is, as illustrated in FIG. 4, the first to seventh bits of the read data symbol correspond to 1, respectively.

It is assumed that a selected memory cell has a threshold voltage corresponding to a second voltage area VA2. As illustrated in FIG. 3, the second voltage area VA2 corresponds to a level higher than the first read voltage Vr1 and lower than the second read voltage Vr2. Therefore, when the first read voltage Vr1 is applied to a selected memory cell, a selected memory cell is turned off. When the second to seventh read voltages Vr2 to Vr7 are sequentially applied to the selected memory cell, the selected memory cell is turned on. That is, as illustrated in FIG. 4, the first bit of the read data symbol corresponds to 0, and the second to seventh bits of the read data symbol correspond to 1 (e.g., the read data symbol illustrated in FIG. 4 for VA2 is 0111111, where the first bit of the read data symbol is 0, and the second through seventh bits are 1s).

Likewise, FIG. 3 illustrated the patterns of read data symbols when the threshold voltages of a selected memory cell respectively correspond to third to eighth voltage areas VA3 to VA8.

Each read data symbol may correspond to a 3-bit symbol. For example, the 3-bit symbol is represented according to the number of 1s (e.g., a read data symbol having seven 1's ("1111111") may have the three bit symbol of 111, and the read data symbol having no 1's ("0000000") may be 000).

It is assumed that a selected memory cell has a threshold voltage corresponding to the first voltage area VA1. When the first to seventh read voltages Vr1 to Vr7 are sequentially applied to the selected memory cell, the read data symbol corresponds to "1111111". In the read data symbol, since the number of 1 is 7, the 3-bit symbol may be represented as "111".

It is assumed that a selected memory cell has a threshold voltage corresponding to the fourth voltage area VA4. When the first to seventh read voltages Vr1 to Vr7 are sequentially applied to the selected memory cell, the read data symbol corresponds to "0001111". In the read data symbol, since the number of 1 is 4, the 3-bit symbol may be represented as "100".

Likewise, FIG. 3 illustrates exemplary 3-bit symbols respectively corresponding to read data symbols.

As illustrated in FIG. 4, a read data symbol that is obtained by reading a selected memory cell at least one time may correspond to a bit symbol. The threshold voltage information of the selected memory cell is represented in a bit symbol. The bit symbol may be used in a succeeding operation such as a soft decision. A soft decision may be determining a likelihood ratio of received data. For example, the likelihood ratios can be determined for the first and second states S1 and S2 (see FIG. 3) of a bit symbol of an observation memory cell (e.g., a memory cell that receives interference from adjacent memory cells), respectively. That is, the read data symbol may be used in a succeeding operation such as a soft decision.

Figure 5:
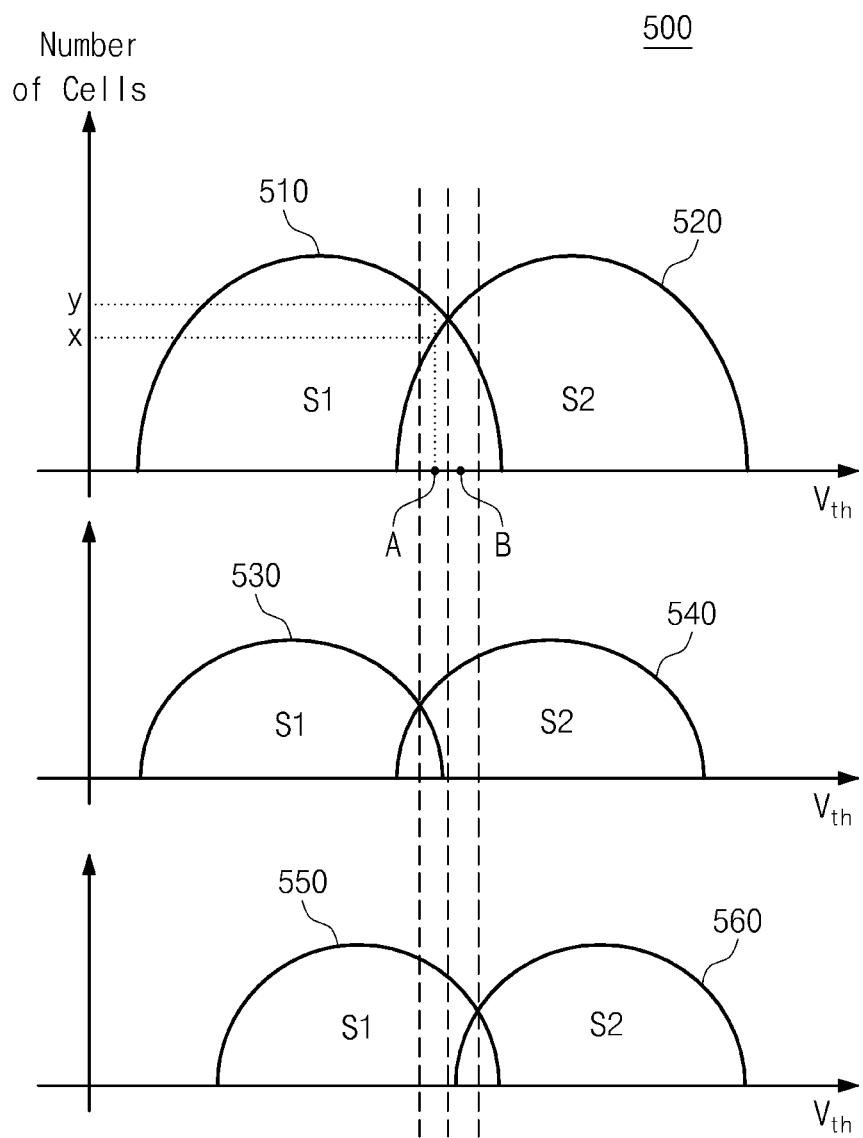
FIG. 5 is a diagram exemplarily illustrating the threshold voltage dispersions of memory cells which have been changed by the interference of adjacent cells according to exemplary embodiments of the present general inventive concept.

FIG. 5 is a diagram exemplarily illustrating the threshold voltage dispersions 500 of memory cells which have been changed by the interference of adjacent cells. In FIG. 5, the abscissa axis (e.g., the horizontal axis) indicates the threshold voltages of memory cells (e.g., $V_{th}$), and the ordinate axis (e.g., vertical axis) indicates the number of memory cells.

In FIG. 5, the first and second states S1 and S2 of the memory cells are illustrated. However, the memory cells are not limited to have the first and second states S1 and S2. The memory cells may store at least one bit in each cell. That is, the memory cells may have at least two states.

Dispersions 510, 530, and 550 may correspond to memory cells having the first state S1, respectively. Dispersions 520, 540, and 560 correspond to memory cells having the second state S2, respectively.

Hereinafter, while referring to FIG. 5, it is assumed that the memory cells corresponding to the dispersions 510 and 520 may have a lower threshold voltage than the threshold voltages of peripheral memory cells, respectively. When the memory cells corresponding to the dispersions 510 and 520 receive interference from the peripheral memory cells, the threshold voltages of the memory cells corresponding to the dispersions 510 and 520 may increase by lateral charge spreading and F-Poly coupling.

The threshold voltages of memory cells that receive less interference from peripheral cells among the dispersions 510 and 520 may be maintained at lower voltages (e.g., lower voltages than the memory cells having the dispersions 530, 540, 550, and 560). The threshold voltages of memory cells that receive a large and/or increased interference from peripheral cells among the dispersions 510 and 520 may increase.

Therefore, the threshold voltages of memory cells, which receive less interference from peripheral memory cells among memory cells corresponding to the dispersions 510 and 520, can form the dispersions 530 and 540. The threshold voltages of memory cells, which may receive large interference from peripheral memory cells among memory cells corresponding to the dispersions 510 and 520, form the dispersions 550 and 560.

The dispersion 510 can be formed by summing memory cells forming the dispersion 530 and memory cells forming the dispersion 550. The dispersion 520 can be formed by summing memory cells forming the dispersion 540 and memory cells forming the dispersion 560.

It is assumed that a selected memory cell can have a threshold voltage corresponding to A. The selected memory cell may be in the first state S1 or the second state S2. A probability that the selected memory cell may be in the first state S1 may be expressed as the number of memory cells having a threshold voltage corresponding to A and the rate of the number of memory cells having the first state S1. A probability that the selected memory cell may be in the second state S2 may be expressed as the number of memory cells having a threshold voltage corresponding to A and the rate of the number of memory cells having the second state S2.

A probability that a selected memory cell having a threshold voltage corresponding to A may be in the first state S1 may be expressed as "y/(x+y)". A probability that a selected memory cell having a threshold voltage corresponding to A may be in the second state S2 may be expressed as "x/(x+y)". "y/(x+y)" may be greater than "x/(x+y)". That is, a probability that the selected memory cell having a threshold voltage corresponding to A may be a memory cell having the second state S2 is greater than a probability that the selected memory cell may be a memory cell having the first state S1.

Referring again to FIG. 3, exemplarily, there is a high probability and/or increased probability that memory cells having a threshold voltage corresponding to the first voltage area VA1 may be memory cells having the first state S1. There is a high probability and/or increased probability that memory cells having a threshold voltage corresponding to the eighth voltage area VA8 may be memory cells having the second state S2.

A calculated result may be described in correspondence with the bit symbol that has been described above with reference to FIGS. 3 and 4. FIG. 4 exemplarily illustrates a 3-bit symbol corresponding to a read data symbol. Referring to FIGS. 3 and 4, when the 3-bit symbol is "111", the threshold voltage of a selected memory cell can be included in the first voltage area VA1. Therefore, there is a high probability and/or increased probability that the state of the selected memory cell may be the first state S1. That is, when the 3-bit symbol is "111", this may correspond to a probability that the selected memory cell may be a memory cell having the first state S1.

When the 3-bit symbol is "000", the threshold voltage of a selected memory cell can be included in the eighth voltage area VA8. Therefore, there is a low probability and/or decreased probability that the state of the selected memory cell may be a memory cell having the first state S1. That is, when the 3-bit symbol is "000", this may correspond to a probability that the selected memory cell may be a memory cell having the first state S1 (e.g., where the corresponding probability that the state of the selected memory cell may be a memory cell having the first state S1 is a low probability and/or decreased probability). Likewise, when the 3-bit symbol is "001" or "110", this may correspond to a probability that the selected memory cell may be a memory cell having the first state S1.

The bit symbol may not be limited to correspond only to the probability that the selected memory cell may be the memory cell having the first state S1. The bit symbol may correspond to a probability of the memory cell having the second state S2.

That is, a probability of the first state S1 or a probability of the second state S2 may be expressed as a bit symbol. The bit symbol may be used in a succeeding operation such as a likelihood ratio calculation and a soft decision.

In the dispersions 530 and 540, a probability that a selected memory cell having a threshold voltage corresponding to A may be a memory cell having the second state S2 is calculated as higher than (i.e., greater than) a probability that the selected memory cell may be a memory cell having the first state S1. In the dispersions 550 and 560, however, a probability that the selected memory cell having the threshold voltage corresponding to A may be a memory cell having the first state S1 can be calculated as higher than a probability that the selected memory cell may be a memory cell having the second state S2. In the dispersions 510 and 520, a probability that the selected memory cell having the threshold voltage corresponding to A may be a memory cell having the first state S1 is calculated as higher than a probability that the selected memory cell may be a memory cell having the second state S2. In the selected memory cell having the threshold voltage corresponding to A, therefore, a probability may be differently calculated according to the size of interference from adjacent cells.

In the dispersions 550 and 560, likewise, a probability that a selected memory cell having a threshold voltage corresponding to B may be a memory cell having the first state S1 can be calculated as higher than (e.g., calculated to be greater than) a probability that the selected memory cell may be a memory cell having the second state S2. In the dispersions 530 and 540, however, a probability that the selected memory cell having the threshold voltage corresponding to B may be a memory cell having the second state S2 can be calculated as higher than (e.g., calculated to be greater than) a probability that the selected memory cell may be a memory cell having the first state S1. In the dispersions 510 and 520, a probability that the selected memory cell having the threshold voltage corresponding to B may be a memory cell having the second state S2 is calculated as higher than (e.g., is calculated to be greater than) a probability that the selected memory cell may be a memory cell having the first state S1. In the selected memory cell having the threshold voltage corresponding to B, therefore, a probability is differently calculated according to the size of interference from adjacent cells.

Figure 6:
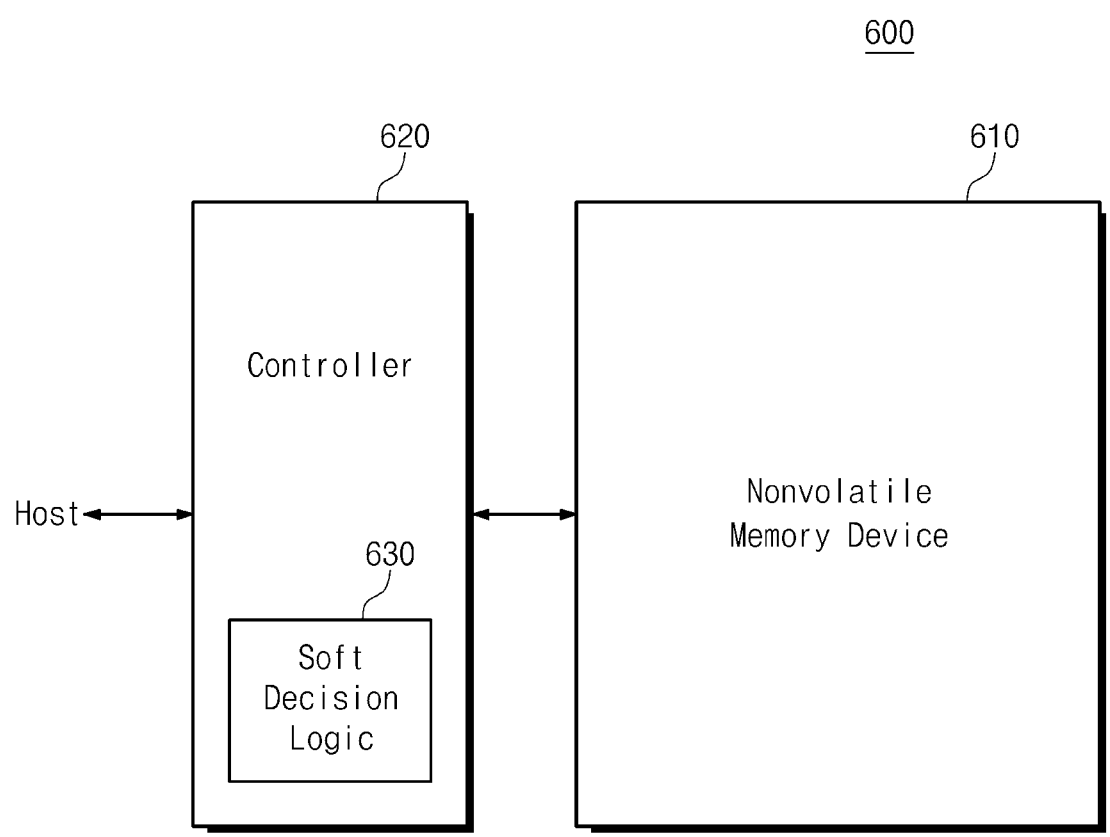
FIG. 6 is a block diagram illustrating a memory system which includes a nonvolatile memory device, according to exemplary embodiments of the present general inventive concept.

FIG. 6 is a block diagram illustrating a memory system 600 which includes a nonvolatile memory device 610, according to exemplary embodiments of the present general inventive concept.

Referring to FIG. 6, a memory system 600 according to exemplary embodiments of the present general inventive concept can include a nonvolatile memory device 610 and a controller 620. The nonvolatile memory device 610 can be the same as and/or similar to the nonvolatile memory device 210 that has been described above with reference to FIG. 2.

The controller 620 can be communicatively connected to a host and the nonvolatile memory device 610. The controller 620 may be a processor, programmable logic device, application specific integrated circuit, field programmable gate array, and/or any other suitable controller to carry out the exemplary embodiments of the present general inventive concept as disclosed herein. In response to a request from the host, the controller 620 can access the nonvolatile memory device 610. For example, the controller 620 can control the reading, writing, and erasing operations of the nonvolatile memory device 610. The controller 620 may be an interface between the nonvolatile memory device 610 and the host. The controller 620 can control and/or drive a firmware (e.g., a firmware that is stored in the controller 620 and/or the nonvolatile memory device 610) to control the nonvolatile memory device 610.

Exemplarily, as described above with reference to FIGS. 1 and 5, the controller 620 can provide a control signal CTRL and an address ADDR to the nonvolatile memory device 610. The controller 620 can exchange data DATA with the nonvolatile memory device 610.

The controller 620 can include a soft decision logic 630. The soft decision logic 630 may be one or more electronic circuits, logic gates, fuzzy logic circuits, and/or any other suitable device (as discussed in the examples below) to carry out the exemplary embodiments of the present general inventive concept. The controller 620 can control the soft decision logic 630. The soft decision logic 630 can receive data stored in a selected memory cell from the nonvolatile memory device 610. The soft decision logic 630 can calculate the likelihood ratio of received data. The soft decision logic 630 can perform the soft decision (e.g., the determination of a likelihood ratio of an observation memory cell, such as the likelihood ratios can be determined for the first and second states S1 and S2 (see FIG. 3) of the bit symbol of the observation memory cell, respectively) of a read data symbol received from the nonvolatile memory device 610. As an example, the soft decision logic 630 may be implemented as a digital circuit, an analog circuit, or a combined circuit of the digital and analog circuits. As another example, the soft decision logic 630 may be implemented in controller-readable and executable codes of software that may be driven in the controller 620. As still another example, the soft decision logic 630 may be a combination of hardware (e.g., electronic circuits, logic gates, etc.) and software (e.g., controller and/or computer readable code, that when executed, carry out the soft logic operations). The soft decision logic 630 will be described in more detail with reference to FIGS. 7 to 10.

The soft decision logic 630 may include an Error Correction Code (ECC) decoder that is the same as and/or similar to the ECC decoder 750 illustrated in FIG. 7 and described below. The ECC decoder 750 can determine and correct a logical value stored in an observation memory cell on the basis of a likelihood ratio of the observation memory cell. An observation memory cell, as discussed in detail below, may be a memory cell that receives interference from adjacent memory cells, and is included in memory cells sharing a selected word line. That is, the likelihood ratio of an observation memory cell can be determined on the basis of a bit symbol of the observation memory cell and interference that the observation memory cell receives. For example, the likelihood ratios can be determined for the first and second states S1 and S2 (see FIG. 3) of the bit symbol of the observation memory cell, respectively.

A host interface of the controller 620 can include a protocol to perform data exchange between the host and the controller 620. Exemplarily, the controller 620 can communicate with the outside (for example, the host) through at least one of a plurality of interface protocols such as a Universal Serial Bus (USB) protocol, a Multimedia Card (MMC) protocol, a Peripheral Component Interconnection (PCI) protocol, a PCI-Express (PCI-E) protocol (i.e., a Peripheral Component Interconnect), an Advanced Technology Attachment (ATA) protocol, a Serial-ATA (SATA) protocol, a Parallel-ATA (PATA) protocol, a Small Component Small Interface (SCSI) protocol, an Enhanced Small Disk Interface (ESDI) protocol and a Integrated Drive Electronics (IDE) protocol. A memory interface of the controller 620 can interface with the nonvolatile memory device 610. For example, the memory interface can include a NAND interface or a NOR interface.

The controller 620 and the nonvolatile memory device 610 may be integrated as one semiconductor device. Exemplarily, the controller 620 and the nonvolatile memory device 610 can be integrated as one semiconductor device to configure a memory card. For example, the controller 620 and the nonvolatile memory device 610 can be integrated as one semiconductor device to configure a memory card such as Personal Computer Memory Card International Association (PCMCIA), Compact Flash (CF), smart media card (SM, SMC), memory stick, multimedia card (MMC, RS- MMC (Reduced Size Multi Media Card), MMCmicro), SD card (SD (Secure Digital), miniSD, microSD, SDHC (Secure Digital High Capacity)) and universal flash memory device.

The controller 620 and the nonvolatile memory device 610 can be integrated as one semiconductor device to configure a semiconductor drive (e.g., Solid State Drive (SSD)). The semiconductor drive (SSD) can include a storage device to store data in a semiconductor memory. When the memory system 600 is used as the semiconductor drive (SSD), the operation speed of a host connected to the memory system 600 can be significantly improved and/or the operation speed can be increased.

As another example, the memory system 600 can be provided as one of a plurality of elements of electronic devices such as computers, Ultra Mobile PCs (UMPCs), workstations, net-books, Personal Digital Assistants (PDAs), portable computers, web tablets, wireless phones, mobile phones, smart phones, e-books, Portable Multimedia Players (PMPs), portable game machines, navigation devices, black boxes, digital cameras, Digital Multimedia Broadcasting (DMB) players, digital audio recorders, digital audio players, digital picture recorders, digital picture players, digital video recorders, digital video players, devices for transmitting/receiving information at a wireless environment, one of various electronic devices configuring a home network, one of various electronic devices configuring a computer network, one of various electronic devices configuring a telematics network, RFID (Radio Frequency Identification) devices and one of a plurality of elements configuring a computing system.

Exemplarily, the nonvolatile memory device 610 or the memory system 600 according to exemplary embodiments of the present general inventive concept may be mounted as various types of packages. For example, the nonvolatile memory device 610 or the memory system 600 according to exemplary embodiments of the present general inventive concept may be packaged in a package type such as Package on Package (PoP), Ball Grid Arrays (BGAs), Chip Scale Packages (CSPs), Plastic Leaded Chip Carrier (PLCC), Plastic Dual In-Line Package (PDIP), Die In Waffle Pack (DIWP), Die In Wafer Form (DIWF), Chip On Board (COB), Ceramic Dual In-Line Package (CERDIP), Plastic Metric Quad Flat Pack (MQFP), Thin Quad Flat Pack (TQFP), Small Outline Package (SOP), Shrink Small Outline Package (SSOP), Thin Small Outline Package (TSOP), Thin Quad Flat Pack (TQFP), System In Package (SIP), Multi Chip Package (MCP), Wafer Level Stack Package (WLSP), Die In Wafer Form (DIWF), Die On Waffle Package (DOWP), Wafer-level Fabricated Package (WFP) and Wafer-Level Processed Stack Package (WSP), thereby being mounted.

Figure 7:
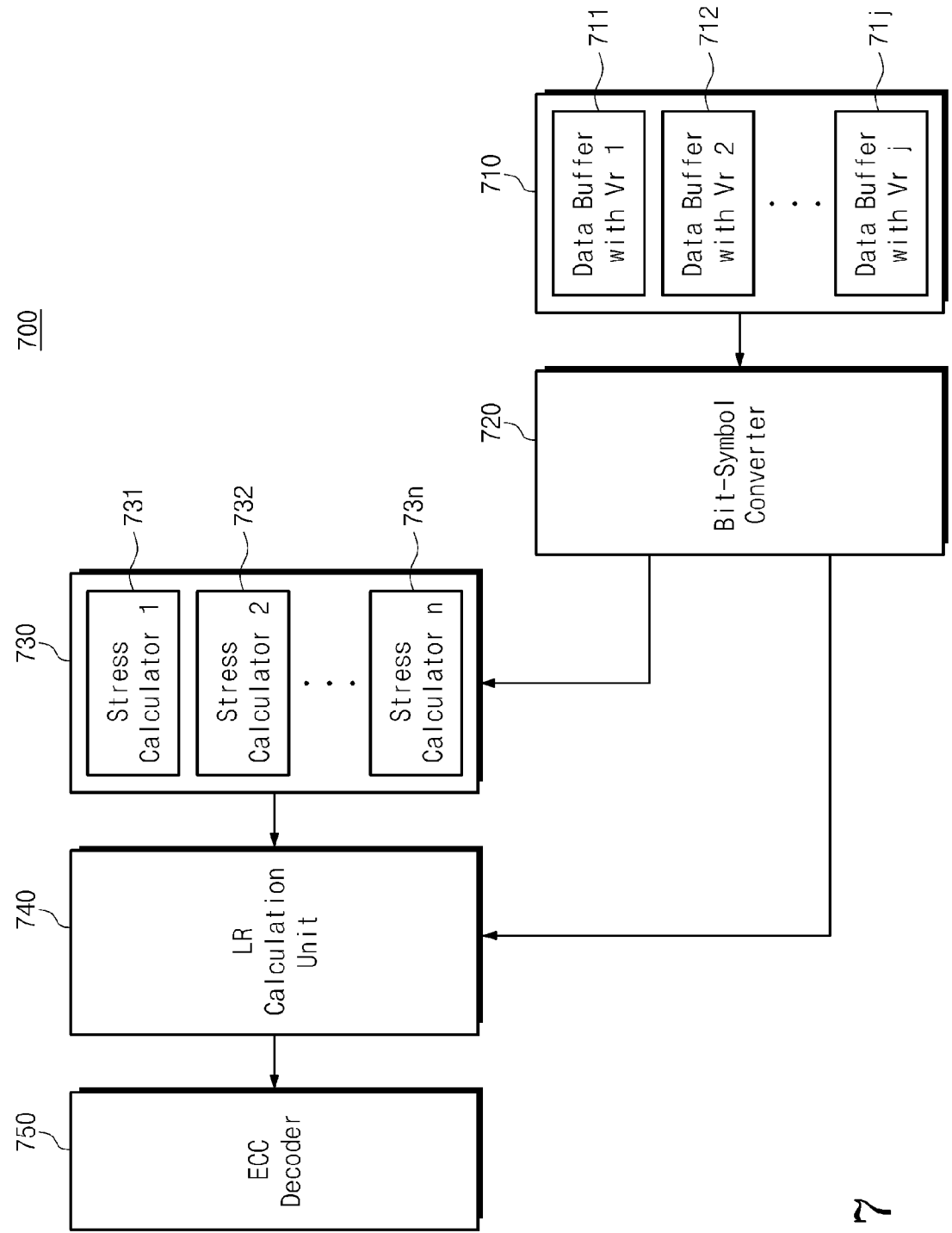
FIG. 7 is a block diagram illustrating a soft decision logic in FIG. 6, according to exemplary embodiments of the present general inventive concept.

FIG. 7 is a block diagram illustrating a soft decision logic in FIG. 6, according to an exemplary embodiments of the inventive concept. That is, the soft decision logic 630 included in the controller 620 illustrated in FIG. 6 is renumbered as soft decision logic 700 as illustrated in FIG. 7.

Referring to FIG. 7, a soft decision logic 700 according to exemplary embodiments of the present general inventive concept includes a data buffer unit 710, a bit symbol converter 720, an interference calculation unit 730, a Likelihood Ratio (LR) calculation unit 740, and an Error Correction Code (ECC) decoder 750.

The data buffer unit 710 can receive and store a read data symbol from the nonvolatile memory device 610 of FIG. 6. The data buffer unit 710 can include first to jth data buffers 711 to 71j.

Exemplarily, in the cases of NAND flash memories, one read voltage can be applied to a word line and a reading operation can be performed in one page unit or in any other suitable unit. When first to jth read voltages are applied to the memory cells of a selected word line, a j number of pages can be read.

Exemplarily, read data that are read by applying a first read voltage Vr1 to the memory cells of a selected word line can be stored in the first data buffer 711. Likewise, read data that are read by applying second to jth read voltages Vr2 to Vrj to the memory cells of a selected word line are respectively stored in the second to jth data buffers 712 to 71j.

The read data of one memory cell that are read using first to jth read voltages form one read data symbol.

A memory cell (hereinafter referred to as an observation memory cell) receiving interference from adjacent memory cells can be included in memory cells sharing a selected word line. Memory cells (hereinafter referred to as interference memory cells) adjacent to the observation memory cell can be included in memory cells sharing the selected word line.

The bit symbol converter 720 can convert the read data symbol of the data buffer unit 710 into a bit symbol. Exemplarily, the bit symbol converter 720 can convert the read data symbol into an i-bit symbol. Herein, j may be "$(2^i)-1$". That is, the value of j may be the same as the value of $(2^i)-1$. For example, when i is 3, j may be 7 (i.e., $2^3-1$). As an example, as described above with reference to FIG. 4, the bit symbol converter 720 can convert a read data symbol into a 3-bit symbol when a 3-bit fractional reading operation is performed. For example, the bit symbol converter 720 can convert a read bit symbol into a 3-bit symbol by counting the number of 1s in the read data symbol.

The interference calculation unit 730 can receive the bit symbols of memory cells that have been converted through the bit symbol converter 720. The converted bit symbols of the memory cells include threshold information. The interference calculation unit 730 can include first to nth interference calculators 731 to 73n.

According to exemplary embodiments of the present general inventive concept, the likelihood ratio of an observation memory cell can be calculated on the basis of the degree where the threshold voltage of the observation memory cell is changed by the interference of adjacent memory cells. The observation memory cell can be one of a plurality of memory cells sharing a selected word line. Interference memory cells may also be one or more memory cells sharing the selected word line.

The first interference calculator 731 can calculate interference that the observation memory cell receives from the interference memory cells, on the basis of the bit symbols of interference memory cells. Exemplarily, interference that a first observation memory cell receives can be calculated on the basis of the bit symbols of interference memory cells that share a word line with an observation memory cell.

Likewise, the second to nth interference calculators 732 to 73n can calculate interferences the second to nth observation memory cells receive from interference memory cells, respectively.

Exemplarily, it can be assumed that an observation memory cell is programmed from the erasing state E0 (see FIG. 1) into one or more programming states (e.g., P1, P2, P3, etc. as illustrated in FIG. 1) and/or back to the erasing state E0. It is assumed that an interference memory cell can be programmed from the erasing state E0 into the programming state P1 (see FIG. 1). In this case, F-Poly coupling can be noticeable in the observation memory cell.

Exemplarily, it can be assumed that an observation memory cell is programmed from the erasing state E0 (see FIG. 1) into one or more programming states and the erasing state E0. It is assumed that an interference memory cell can be programmed from the erasing state E0 into the programming state P1 (see FIG. 1). In this case, interference that the observation memory cell receives can be less than interference that the observation memory cell receives when the interference memory cell is programmed into a programming state P3 (see FIG. 3).

The likelihood ratio calculation unit 740 can calculate the likelihood ratio of an observation memory cell on the basis of the bit symbol of the observation memory cell and interference that the observation memory cell receives. For example, the likelihood ratio calculation unit 740 can calculate the logarithmic likelihood ratio of the observation memory cell. As an example, the likelihood ratio calculation unit 740 can calculate likelihood ratios for the first and second states S1 and S2 (see FIG. 3) of the bit symbol of the observation memory cell, respectively.

Exemplarily, the likelihood ratio calculation unit 740 can store information for the threshold voltage dispersions of memory cells. For example, the likelihood ration calculation unit 740 can store information of threshold voltage dispersions based on interference. Based on the stored information, the likelihood ratio calculation unit 740 can calculate likelihood ratios for the first and second states S1 and S2 of the observation memory cell, respectively.

Exemplarily, a likelihood ratio can be calculated at the rate of two conditional probabilities. For example, as expressed in Equations (1) and (2) below, the likelihood ratio can be calculated at the rate of a probability that a memory cell corresponding to a received bit symbol is in the first state S1 to a probability that the memory cell corresponding to the received bit symbol is in the second state S2, where the rate of probability is rip in the equations below). For example, the probability that the memory cell corresponding to the received bit symbol is in the first state S1 or the second state S2 may be calculated on the basis of information for threshold voltage dispersions based on interference.

$$\text{likelihood ratio} = P(r|p=S1)/P(r|p=S2) \qquad (1)$$

Referring to Equation (1), a likelihood ratio may be calculated by dividing a probability that a memory cell corresponding to a bit symbol data received by the likelihood ratio calculation unit 740 is programmed into the first state S1 by a probability that the bit symbol data received by a probability that the likelihood ratio calculation unit 740 is programmed into the second state S2.

$$\text{likelihood ratio} = P(r|p=S2)/P(r|p=S1) \qquad (2)$$

In Equation (2), a likelihood ratio may be calculated by dividing a probability that a memory cell corresponding to a bit symbol data received by the likelihood ratio calculation unit 740 is in the second state S2 by a probability of the first state S1.

Exemplarily, information of threshold voltage dispersions can be provided through measurement. For example, the controller 620 can measure the threshold voltage dispersions of memory cells in the nonvolatile memory device 610 and store the measured dispersions in the likelihood ratio calculation unit 740. When the threshold voltage dispersions of the memory cells are changed, the information of the threshold voltage dispersions stored in the likelihood ratio calculation unit 740 can be updated. As an example, when the threshold voltage dispersions of the memory cells are varied, the controller 620 can re-measure the threshold voltage dispersions of the memory cells of the nonvolatile memory device 610. Exemplarily, re-measurement can be performed based on the deterioration (for example, the number of programming and erasing times) of the memory cells of the nonvolatile memory device 610. Exemplarily, the measurement of threshold voltage dispersions can be performed through fractional read.

As another example, threshold voltage information based on interference can be provided in a predetermined table type. The likelihood ratio calculation unit 740 can calculate the likelihood ratio of a bit symbol, based on the predetermined table.

The ECC decoder 750 can receive the likelihood ratio of an observation memory cell that is calculated from the likelihood ratio calculation unit 740. The ECC decoder 750 can determine a logical value stored in the observation memory cell on the basis of the likelihood ratio of the observation memory cell. For example, the ECC decoder 750 can compare likelihood ratios for the first and second states (see FIG. 3) to select a state corresponding to the maximum likelihood ratio. The logical value determined by the ECC decoder 750 may be provided as a read data that a host requests.

Figure 8:
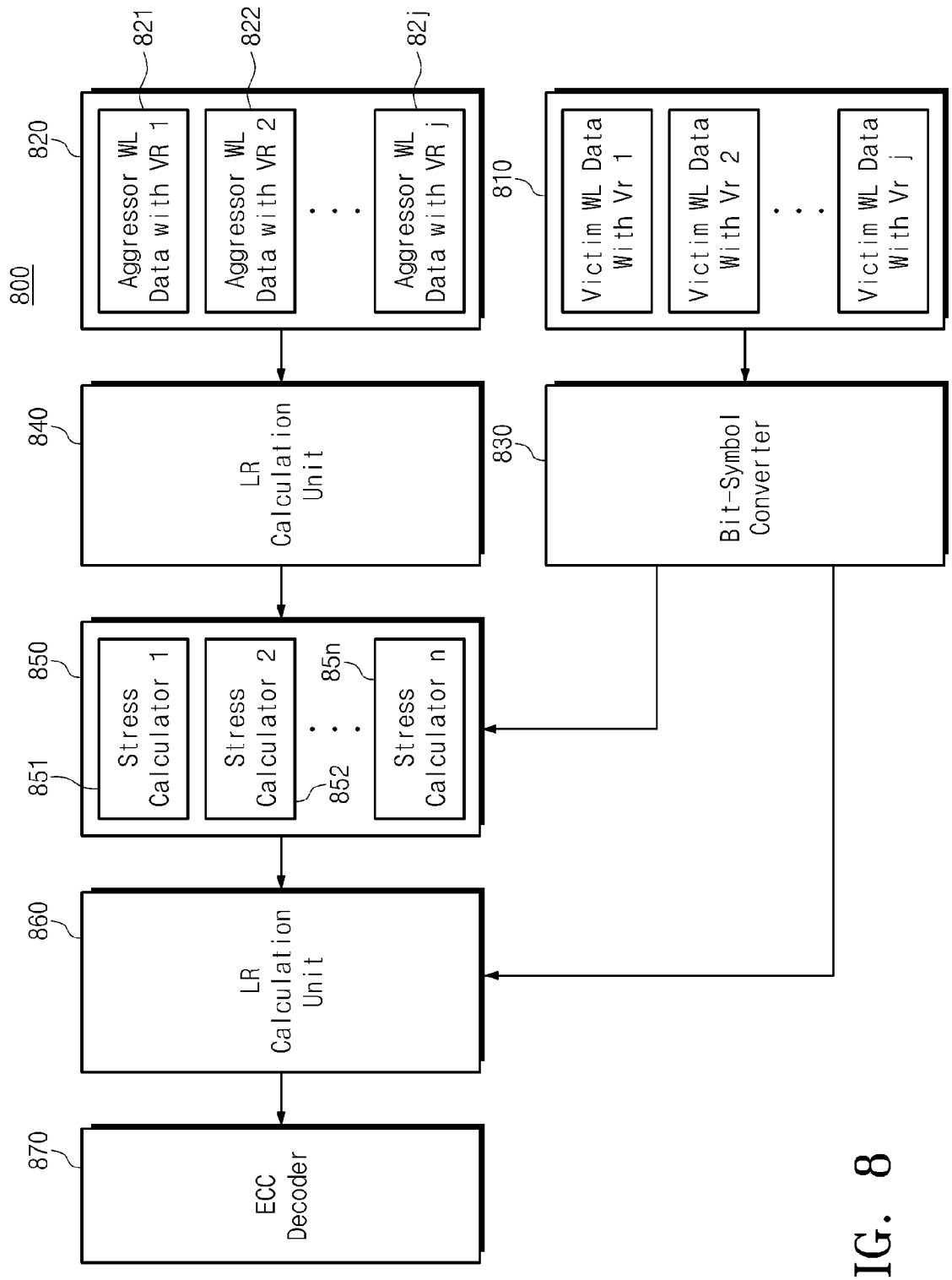
FIG. 8 is a block diagram illustrating a soft decision logic in FIG. 6, according to exemplary embodiments of the present general inventive concept.

FIG. 8 is a block diagram illustrating a soft decision logic in FIG. 6, according to another embodiment of the inventive concept. That is, the soft decision logic 630 included in the controller 620 illustrated in FIG. 6 is renumbered as soft decision logic 800 as illustrated in FIG. 7.

Referring to FIG. 8, a soft decision logic 800 according to exemplary embodiments of the inventive concept can include first and second data buffer units 810 and 820, first and second bit symbol converters 830 and 840, an interference calculation unit 850, a Likelihood Ratio (LR) calculation unit 860, and an Error Correction Code (ECC) decoder 870.

The first data buffer unit 810 may be similar to and/or the same as the data buffer unit 710 illustrated in FIG. 7 and described above, and the first bit symbol converter 830 may be similar to and/or the same as the bit symbol converter 720 illustrated in FIG. 7 and described above.

The second data buffer unit 820 can receive read data symbols from the memory cells of an unselected word line adjacent to a selected word line and can store the received symbols. The second data buffer unit 820 can include first to jth data buffers 821 to 82j.

Exemplarily, in the cases of NAND flash memories, one read voltage can be applied to a word line and a reading operation can be performed in one page unit. When first to jth read voltages are applied to the memory cells of a selected word line, a j number of pages can be read.

Exemplarily, read data that are read by applying a first read voltage Vr1 to the memory cells of a selected word line can be stored in the first data buffer 821. Likewise, read data that are read by applying second to jth read voltages Vr2 to Vrj to the memory cells of a selected word line can be respectively stored in second to jth data buffers 822 to 82j.

The read data of one memory cell that are read using first to jth read voltages can form one read data symbol. Read data symbols received from the memory cells of an unselected word line can be used to calculate interference that an observation memory cell receives from interference memory cells.

The second bit symbol converter 840 can convert the read data symbol of the second data buffer unit 820 into a bit symbol. The second bit symbol converter 840 can be configured the same as and/or similar to where the first bit symbol converter 830 receives a read data symbol and converts it into an i-bit symbol. Herein, j may be "(2^i)−1".

That is, the first bit symbol converter 830 can store information for the threshold voltages of the memory cells of a selected word line. The second bit symbol converter 840 can store information for the threshold voltages of the memory cells of an unselected word line adjacent to the selected word line.

Herein, the observation memory cell can be included in memory cells sharing the selected word line. The interference memory cells can be included in memory cells that share a word line with the observation memory cell and memory cells that do not share a word line with the observation memory cell.

The interference calculation unit 850 can receive the bit symbols of memory cells that have been converted through the first and second bit symbol converters 830 and 840. The converted bit symbols of the memory cells can include threshold information. The interference calculation unit 850 can include first to nth interference calculators 851 to 85n.

The first to nth interference calculators 851 to 85n can calculate interferences that first to nth observation memory cells receive from interference memory cells, respectively. The soft decision logic 700 according to exemplary embodiments of the present general inventive concept can calculate the interference of interference memory cells sharing a selected word line. The soft decision logic 800 according to exemplary embodiments of the present general inventive concept may also calculate the interference of interference memory cells sharing a selected word line and the interference of interference memory cells not sharing the selected word line.

Figure 9:
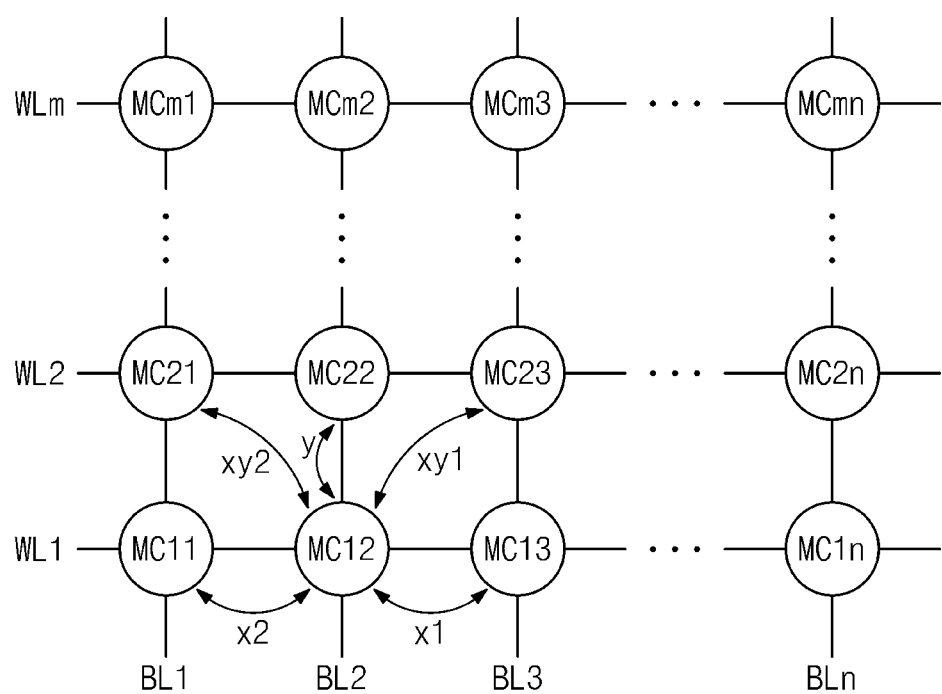
FIG. 9 is a block diagram illustrating a memory cell array of FIG. 2 according to exemplary embodiments of the present general inventive concept.

FIG. 9 is a block diagram illustrating memory cell array 900, which may be similar to and/or the same as the memory cell array 210 illustrated in FIG. 2 and described above. Memory cell array 900 can include word lines (e.g., WL1, WL2, . . . , WLm), bit lines (e.g., BL1, BL2, BL3, . . . , BLn), and memory cells (MC11 to MC1n, MC11 to MCm1, and MC11 to MCmn).

Exemplarily, it is assumed that an observation memory cell is a memory cell MC12. Interference memory cells MC13 and MC11 that are disposed in x1 and x2 directions are memory cells that can share a word line with the observation memory cell MC12. Therefore, interference the observation memory cell MC12 receives from the interference memory cells MC13 and MC11 that are disposed in x1 and x2 directions can be calculated as described above with reference to FIG. 7.

The threshold voltage information of an interference memory cell MC22 can be stored in the second bit symbol converter 840 of FIG. 8. Accordingly, interference that the observation memory cell MC12 receives from the interference memory cell MC22 that is disposed in a y direction may be calculated.

The threshold voltage information of interference memory cells MC23 and MC21 can be stored in the second bit symbol converter 840 of FIG. 8. Therefore, interference that the observation memory cell MC12 receives from the interference memory cells MC23 and MC21 that are disposed in xy1 and xy2 directions may be calculated.

By summing respective calculated interferences, interference that the observation memory cell MC12 receives from the interference memory cells can be calculated.

Referring again to FIG. 8, the likelihood ratio calculation unit 860 can be similar to and/or the same as the likelihood ratio calculation unit 740 illustrated in FIG. 7 and described above. That is, a likelihood ratio can be calculated on the basis of a bit symbol and a calculated interference. For example, the likelihood ratio calculation unit 860 can calculate and/or determine a logarithmic likelihood ratio on the basis of a bit symbol and a calculated interference. As an example, the likelihood ratio calculation unit 860 can calculate likelihood ratios for the first and second states S1 and S2 (see FIG. 3) of a bit symbol that is converted. Exemplarily, the likelihood ratio calculation unit 860 can store information for threshold voltage dispersions based on interference. Based on the stored information, the likelihood ratio calculation unit 860 can calculate likelihood ratios for the first and second states S1 and S2 of the bit symbol, respectively.

As another example, threshold voltage information based on interference can be provided in a predetermined table type. The likelihood ratio calculation unit 860 can calculate the likelihood ratio of a bit symbol, based on the predetermined table.

The ECC decoder 870 can receive the likelihood ratio of an observation memory cell that is calculated from the likelihood ratio calculation unit 860. The ECC decoder 870 can be similar to and/or the same as the ECC decoder 750 illustrated in FIG. 7 and described above. The ECC decoder 870 can determine a logical value stored in the observation memory cell on the basis of the likelihood ratio of the observation memory cell. For example, the ECC decoder 870 can compare likelihood ratios for the first and second states (see FIG. 3) to select a state corresponding to the maximum likelihood ratio. The logical value determined by the ECC decoder 870 may be provided as a read data that a host requests.

The first and second data buffer units 810 and 820 and the first and second bit symbol converters 830 and 840 may be included in the nonvolatile memory device 610 illustrated in FIG. 6. Likewise, the data buffer unit 710 and bit symbol converter 720 of FIG. 7 may be included in the nonvolatile memory device 610 illustrated in FIG. 6.

When the data buffer unit 710 and bit symbol converter 720 of FIG. 7 are included in the nonvolatile memory device 610, the data buffer unit 710 and bit symbol converter 720 can be configured and/or operate as described above with reference to FIG. 7. In this case, the data buffer unit 710 and bit symbol converter 720 can operate according to the control of the control logic 250 of FIG. 2.

When first and second data buffer units 810 and 820 and the first and second bit symbol converters 830 and 840 are included in the nonvolatile memory device 610, first and second data buffer units 810 and 820 and the first and second bit symbol converters 830 and 840 can be configured and/or operate as described above with reference to FIG. 8. In this case, first and second data buffer units 810 and 820 and the first and second bit symbol converters 830 and 840 operate according to the control of the control logic 250 of FIG. 2.

Exemplarily, the first data buffer unit 810 included in the nonvolatile memory device 610 can store the data of the memory cells of a selected word line that are read a maximum of (2^i)−1 times. The first bit symbol converter 830 included in the nonvolatile memory device 610 can convert the data of the memory cells of the selected word line into i-bit symbols. The converted i-bit symbols can be transmitted to the interference calculation unit 850 and likelihood ratio calculation unit 860 of the controller 620, respectively. When defining one data as a bit symbol data in the i-bit symbol, the bit symbol data of the memory cells of the selected word line may be transmitted to the controller 620. In this case, the i-bit symbol may be transmitted to the controller 620 *i* times.

The second data buffer unit 820 can be configured and/or operate like the first data buffer unit 810. In exemplary embodiments of the present general inventive concept, the second data buffer 820 can store the data of the memory cells of an unselected word line adjacent to a selected word line. The second bit symbol converter 840 can convert the data of the memory cells of the unselected word line adjacent to the selected word line into i-bit symbol data. The respective converted bit symbol data can be transmitted to the interference calculation unit 850 of the controller 620.

Exemplarily, when an interface between the nonvolatile memory device 610 and the controller 620 is analog (e.g., includes analog electrical circuits), the first bit symbol converter 830 and the second bit symbol converter 840 may be included in the controller 620. In this case, the controller 620 may include an analog-to-digital converter (ADC, not illustrated). The controller 620 can receive the analog values of the data of a selected word line that are read (e.g., read during one time period). The controller 620 can convert the received analog values into digital data through the analog-to-digital converter (ADC, not illustrated) and can store the converted digital data. The data of the selected word line can be read ($2^i$)−1 times in the nonvolatile memory device 610, and the controller 620 can receive the analog data of the selected word line that is read ($2^i$)−1 times. The controller 620 may include an analog-to-digital converter (ADC), and it may convert analog data received into digital data with the ADC and store the converted digital data. The digital data of the selected word line that are stored in the ADC are converted into i-bit symbols by the first bit symbol converter 830. Likewise, the second bit symbol converter 840 can be configured to operate according to the control of the control logic 250 of FIG. 2.

Figure 10:
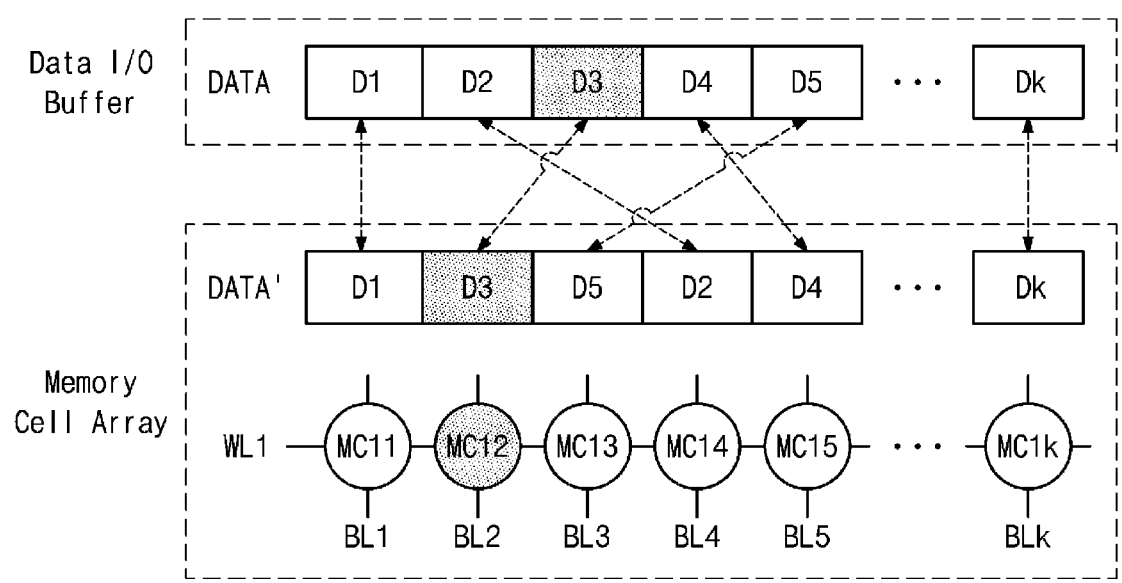
FIG. 10 is a diagram for describing a data bit arrangement of a nonvolatile memory device and a controller shown in FIG. 6 according to exemplary embodiments of the present general inventive concept.

FIG. 10 is a diagram for describing a data bit arrangement of a nonvolatile memory device 610 and a controller 620 shown in FIG. 6. In FIG. 10, there is illustrated k-bit page data.

As described with reference to FIG. 6, a controller 620 exchanges data DATA with a nonvolatile memory device 710. Data DATA provided from the controller 620 is stored in the nonvolatile memory device 610. Also, data DATA stored in the nonvolatile memory device 610 is read out, and the read data is provided to the controller 620.

In exemplary embodiments, in the event that the nonvolatile memory device 610 is a NAND flash memory, a read operation is performed by a page unit using a read voltage applied to a word line. Data stored in a plurality of memory cells sharing a word line is read while page data is read. Data DATA read by the page unit is provided to the controller 620 through a data buffer.

Meanwhile, a bit arrangement of the data DATA is different from that of data DATA' based on a physical arrangement of a plurality of memory cells sharing a word line. the bit arrangement of the data DATA' is changed according to an input/output coding/decoding method of the nonvolatile memory device 610.

In exemplary embodiments, it is assumed that a selected word line is a word line WL1. Also, it is assumed that an observation memory cell is a second memory cell MC12. The second memory cell MC12 may store a third bit D3 of the data DATA.

Referring to FIG. 10, interference memory cells, affecting the observation memory cell MC12, from among memory cells sharing the word line WL1 with the observation memory cell MC12 are first and third memory cells MC11 and MC13. The first and third memory cells MC11 and MC13 store first and fifth bits D1 and D5 of the data DATA, respectively. that is, data stored in the first memory cell MC11, the second memory cell MC12, and the third memory cell MC13 of the selected word line WL1 may not sequentially form the first bit D1, the second bit D2, and the third bit D3 of the data DATA.

As described with reference to FIGS. 7 to 9, a logical value of the third data D3 of the data DATA is determined based on a bit symbol of the interference memory cells on the second memory cell MC12 in which the third bit D3 is stored. As described above, however, since a bit arrangement of the data DATA is different from that of the data DATA', bit arrangement information of the data DATA and DATA' is referred to decide interference memory cells of the second memory cell MC12. This will be more fully described with reference to FIG. 11.

Figure 11:
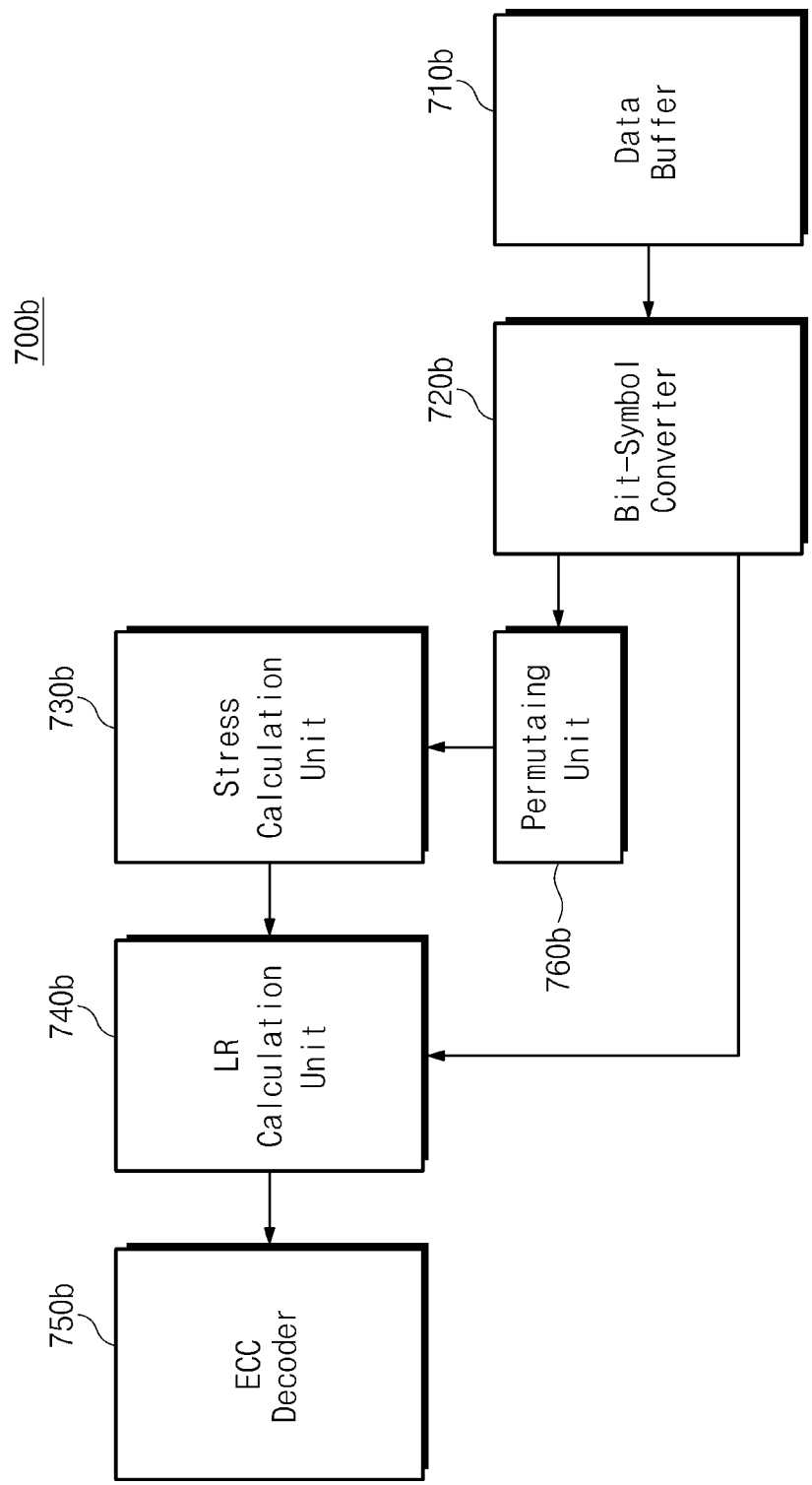
FIG. 11 is a block diagram schematically illustrating a controller shown in FIG. 6, according to another embodiment of the inventive concepts.

FIG. 11 is a block diagram schematically illustrating a controller shown in FIG. 6, according to another embodiment of the inventive concepts. Referring to FIG. 11, a controller 700*b* includes a data buffer 710*b*, a bit-symbol converter 720*b*, a stress calculation unit 730*b*, a likelihood ratio calculation unit 740*b*, an ECC decoder 750*b*, and a permuting unit 760*b*.

The data buffer unit 710*b*, the bit-symbol converter 720*b*, the likelihood ratio calculation unit 740*b*, and the ECC decoder 750*b* of the controller 700*b* shown in FIG. 11 have the same structure and operation as a data buffer 710, a bit-symbol converter 720, an interference calculation unit 730, a likelihood ratio calculation unit 740, and an ECC decoder 750 shown in FIG. 7.

The permuting unit 760*b* generates permutation information based on a physical bit arrangement of data stored in a nonvolatile memory device 610 shown in FIG. 1. The permutation information is information for correcting a difference between a physical bit arrangement of data stored in the nonvolatile memory device 610 and a physical bit arrangement of data received from the nonvolatile memory device 610. In exemplary embodiments, the permutation information includes input/output coding/decoding information of the nonvolatile memory device 610.

The permuting unit 760*b* generates permutation information based on bit arrangement information received from the nonvolatile memory device 610. Or, the permuting unit 760*b* generates permutation information based on previously stored bit arrangement information. The permuting unit 760*b* provides the permutation information to the interference calculation unit 730*b*.

The interference calculation unit 730*b* receives a bit symbol of memory cells converted by the bit-symbol converter 720*b*. The interference calculation unit 730*b* determines interference memory cells on the observation memory cell MC12 using the permutation information. The interference calculation unit 730*b* calculates an interference level of the observation memory cell MC12 based on the bit symbol of the interference memory cells thus determined.

The controller 700*b* may determine interference memory cells on each memory cell using the permuting unit 760*b*. As the controller 700*b* determines a physically adjacent memory cell as an interference memory cell and corrects data according to the determination result, the reliability of data provided from the nonvolatile memory device 600 is improved.

Figure 12:
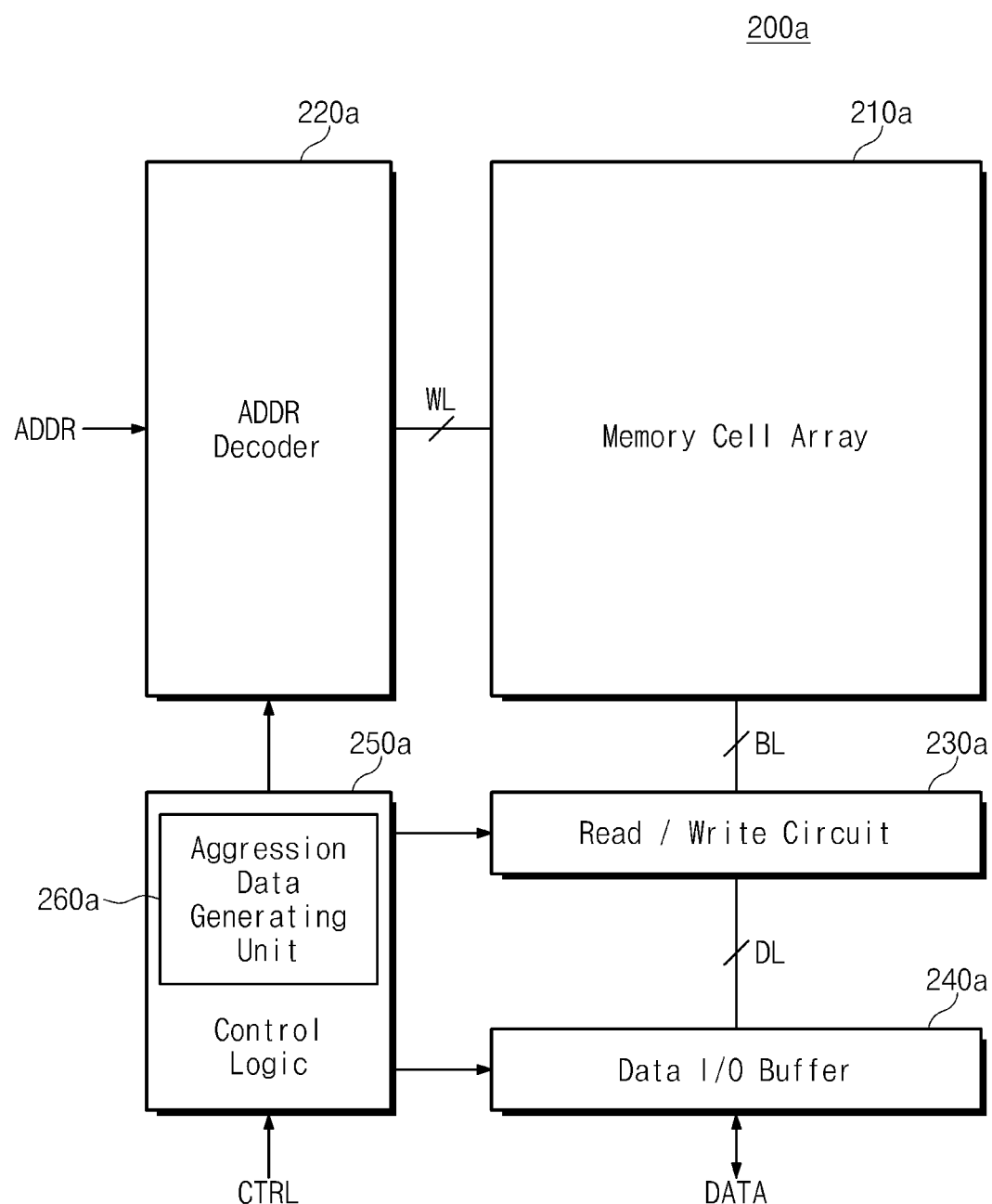
FIG. 12 is a block diagram schematically illustrating a nonvolatile memory device according to another embodiment of the inventive concepts.

FIG. 12 is a block diagram schematically illustrating a nonvolatile memory device 200*a* according to another embodiment of the inventive concepts. Referring to FIG. 12, a nonvolatile memory device 200a includes a memory cell array 210a, an address decoder 220a, a read/write circuit 230a, a data I/O buffer 240a, control logic 250a, and an aggression data generating unit 260a.

The memory cell array 210a, the address decoder 220a, the read/write circuit 230a, and the data I/O buffer 240a of the nonvolatile memory device 200a have the same structure and operation as a memory cell array 210, an address decoder 220, a read/write circuit 230, and a data I/O buffer 240 shown in FIG. 2.

The control logic 250a is connected to the address decoder 220a, the read/write circuit 230a, and the data I/O buffer 240a. The control logic 250a operates in response to a control signal CTRL transferred from an external device.

The control logic 250a includes the aggression data generating unit 260a. The aggression data generating unit 260a is configured to perform an auxiliary read operation of the nonvolatile memory device 200a. At the auxiliary read operation, the aggression data generating unit 260a controls the read/write circuit 230a to determine memory cells, programmed to a predetermined state, from among memory cells sharing an unselected word line adjacent to a selected word line. The aggression data generating unit 260a cooks aggression data based on the memory cells thus determined.

The aggression data generating unit 260a is configured to perform a fractional read operation of the nonvolatile memory device 200a. The fractional read operation of the aggression data generating unit 260a has the same structure and operation as that of a fractional read control unit 260 of FIG. 2. The aggression data generating unit 260a provides a controller with aggression data cooked through the auxiliary read operation and data read through the fractional read operation. An operation of the aggression data generating unit 260a will be more fully described with reference to FIG. 13.

In exemplary embodiments, the aggression data generating unit 260a is implemented by a digital circuit, an analog circuit, or a combination of the digital circuit and the analog circuit. Or, the aggression data generating unit 260a is implemented by software driven by the control logic 250a. As another example, the aggression data generating unit 260a is implemented by a combination of software and hardware.

Figure 13:
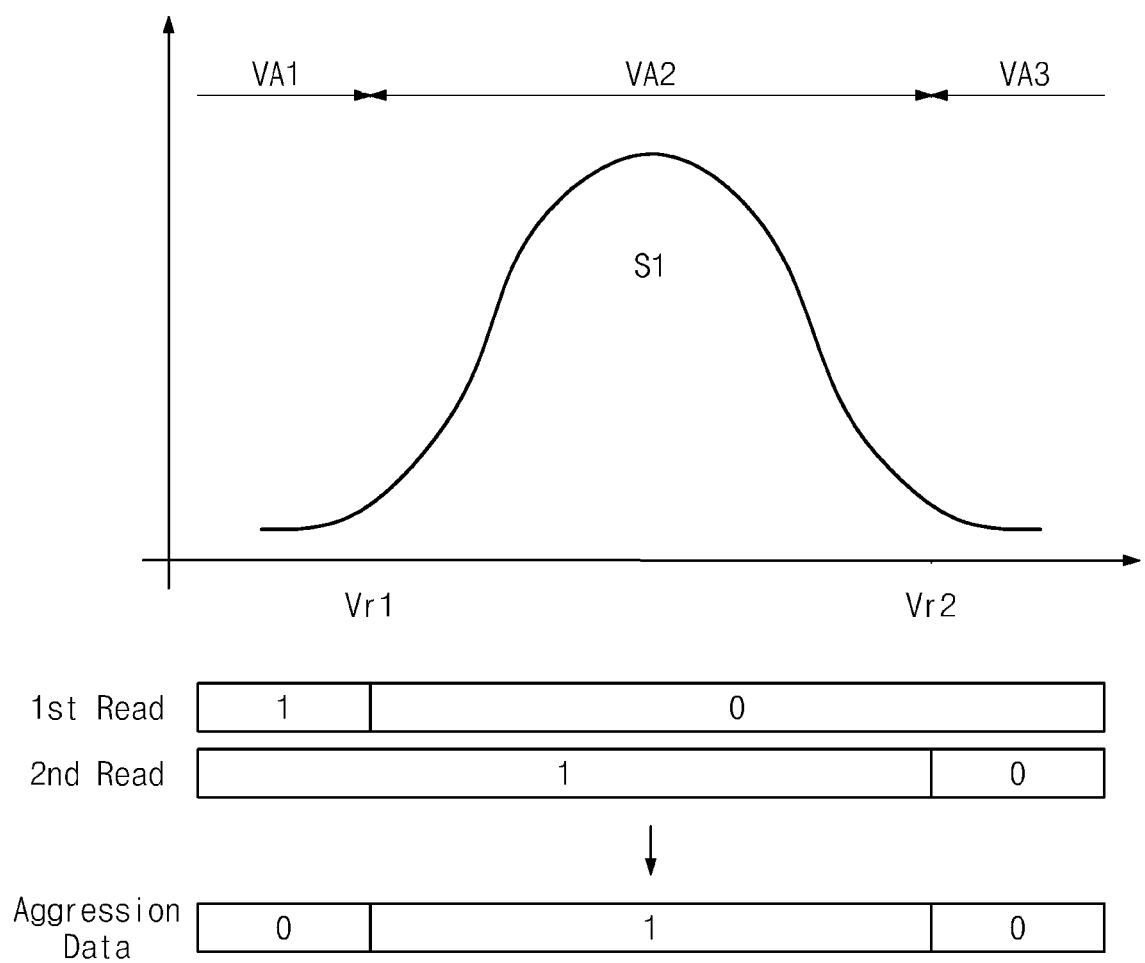
FIG. 13 is a diagram schematically illustrating a threshold voltage distribution of memory cells of a memory cell array shown in FIG. 12 according to exemplary embodiments of the present general inventive concept.

FIG. 13 is a diagram schematically illustrating a threshold voltage distribution of memory cells of a memory cell array 210a shown in FIG. 12. In FIG. 13, a horizontal axis indicates threshold voltages of memory cells, and a vertical axis indicates the number of memory cells. However, the inventive concepts are not limited to such a case that memory cells store data using threshold voltages. For example, memory cells store data using resistance values. In this case, a horizontal axis of FIG. 13 indicates resistance values of memory cells. That is, a resistance value distribution of memory cells is shown in FIG. 3.

In FIG. 13, a first state S1 of memory cells is illustrated. The first state S1 is a state where memory cells adjacent to a memory cell to be programmed to the first state S1 receive interference more than a reference when the memory cell is programmed to the first state. In exemplary embodiments, the first state S1 may be the uppermost program state.

Below, it is assumed that memory cells placed at a left side on the basis of first and second read voltages Vr1 and Vr2 correspond to a logical '1' and memory cells placed at a right side on the basis of the first and second read voltages Vr1 and Vr2 correspond to a logical '0'. However, the inventive concepts are not limited thereto.

Referring to FIGS. 12 and 13, an aggression data generating unit 260a is configured to control an auxiliary read operation. At the auxiliary read operation, the aggression data generating unit 260a controls a read/write circuit 230a to perform at least one read operation on memory cells sharing an unselected word line adjacent to a selected word line.

In exemplary embodiments, the aggression data generating unit 260a controls the read/write circuit 230a to read memory cells twice using the first and second read voltages Vr1 and Vr2. In exemplary embodiments, the first and second read voltages Vr1 and Vr2 are sequentially applied to memory cells. In exemplary embodiments, the second and first read voltages Vr2 and Vr1 are sequentially applied to memory cells.

The aggression data generating unit 260a cooks aggression data based on a bit read using the first and second read voltages Vr1 and Vr2. The aggression data is data indicating whether each memory cell sharing an unselected word line adjacent to a selected word line is programmed to a first state. In exemplary embodiments, a logical '1' of the aggression data indicates that a corresponding memory cell is programmed to the first state. In exemplary embodiments, the aggression data is cooked through an exclusive OR operation of a bit read using the first read voltage Vr1 and a bit read using the second read voltage Vr2.

The aggression data generating unit 260a provides a controller with the cooked aggression data and data read from the selected word line. The controller determines logical values of memory cells sharing the selected word line based on the aggression data.

The above-described nonvolatile memory device 200a only determines whether memory cells sharing an unselected word line adjacent to a selected word line have a predetermined state, for example, a first state, so read burden is reduced as compared with a memory device 200 shown in FIG. 2. Also, the nonvolatile memory device 200a provides a controller with aggression data, whose size is reduced through cooking, instead of a bit symbol of memory cells connected to an unselected word line, so input/output burden is reduced as compared with the memory device 200 shown in FIG. 2.

Meanwhile, in FIGS. 12 and 13, a predetermined state the aggression data generating unit 260a determines is not limited to one state. In exemplary embodiments, the aggression data generating unit 260a determines whether to belong to one of a plurality of states of memory cells and cooks aggression data according to the determination result.

Figure 14:
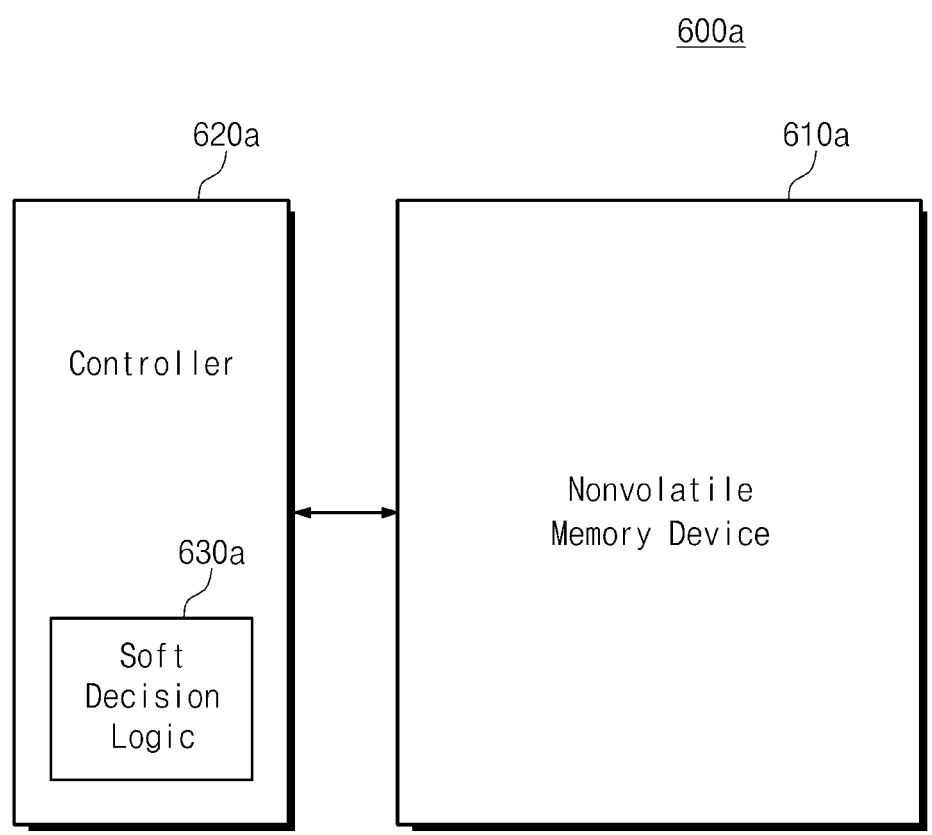
FIG. 14 is a block diagram schematically illustrating a memory system including a nonvolatile memory device shown in FIG. 12 according to exemplary embodiments of the present general inventive concept.

FIG. 14 is a block diagram schematically illustrating a memory system including a nonvolatile memory device shown in FIG. 12. A memory system 600a includes a nonvolatile memory device 610a and a controller 620a.

The controller 620a is connected to a host and the nonvolatile memory device 610a. The controller 620a provides the nonvolatile memory device 610a with a control signal CTRL and an address ADDR. The controller 620a exchanges data with the nonvolatile memory device 610a.

The controller 620a includes soft decision logic 630a. The controller 620a controls the soft decision logic 630a. The soft decision logic 630a receives data stored in a selected memory cell. Also, the soft decision logic 630a receives aggression data from the nonvolatile memory device 610a. The soft decision logic 630a is configured to perform soft decision on data received from the nonvolatile memory device 610a based on the aggression data.

Figure 15:
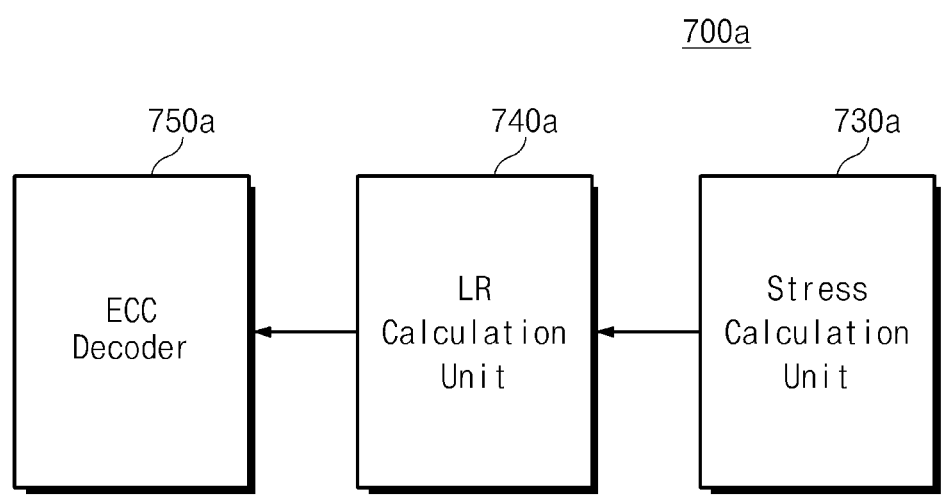
FIG. 15 is a block diagram schematically illustrating soft decision logic shown in FIG. 14 according to exemplary embodiments of the present general inventive concept.

FIG. 15 is a block diagram schematically illustrating soft decision logic shown in FIG. 14. Referring to FIG. 15, soft decision logic 700a includes a stress calculation unit 730a, a likelihood ratio calculation unit 740a, and an ECC decoder 750.

The stress calculation unit 730a receives data from a nonvolatile memory device 610a. In exemplary embodiments, data received from the nonvolatile memory device 610a is a read data symbol or a bit symbol.

The stress calculation unit 730a receives aggression data from the nonvolatile memory device 610a. The stress calculation unit 730a receives data and aggression data through a data buffer unit.

The stress calculation unit 730a calculates an interference level of a selected memory cell affected by interference memory cells based on aggression data. In exemplary embodiments, the stress calculation unit 730a calculates an interference level of a selected memory cell based on aggression data of memory cells, adjacent to the selected memory cell, from among memory cells connected to an unselected word line adjacent to the selected word line. In exemplary embodiments, when aggression data of the adjacent memory cell is a logical '1', the stress calculation unit 730a determines an interference level of the selected memory cells affected by the adjacent memory cell to be over a predetermined interference level.

The likelihood ratio calculation unit 740a calculates a likelihood ratio of the selected memory cell based on data (e.g., provided in a bit-symbol type) stored in the selected memory cell and an interference level of the selected memory cell. For example, the likelihood ratio calculation unit 740a calculates a logarithmic likelihood ratio of the selected memory cell.

In the event that data is provided in a bit-symbol type, the likelihood ratio calculation unit 740a calculates a likelihood ratio of each state of a selected memory cell based on a bit symbol of the selected memory cell.

The ECC decoder 750a receives a likelihood ratio of the selected memory cell from the likelihood ratio calculation unit 740a. The ECC decoder 750a determines a logical value stored in the selected memory cell based on the likelihood ratio of the selected memory cell. The logical value determined by the ECC decoder 750a is provided as read data a host requests.

Figure 16:
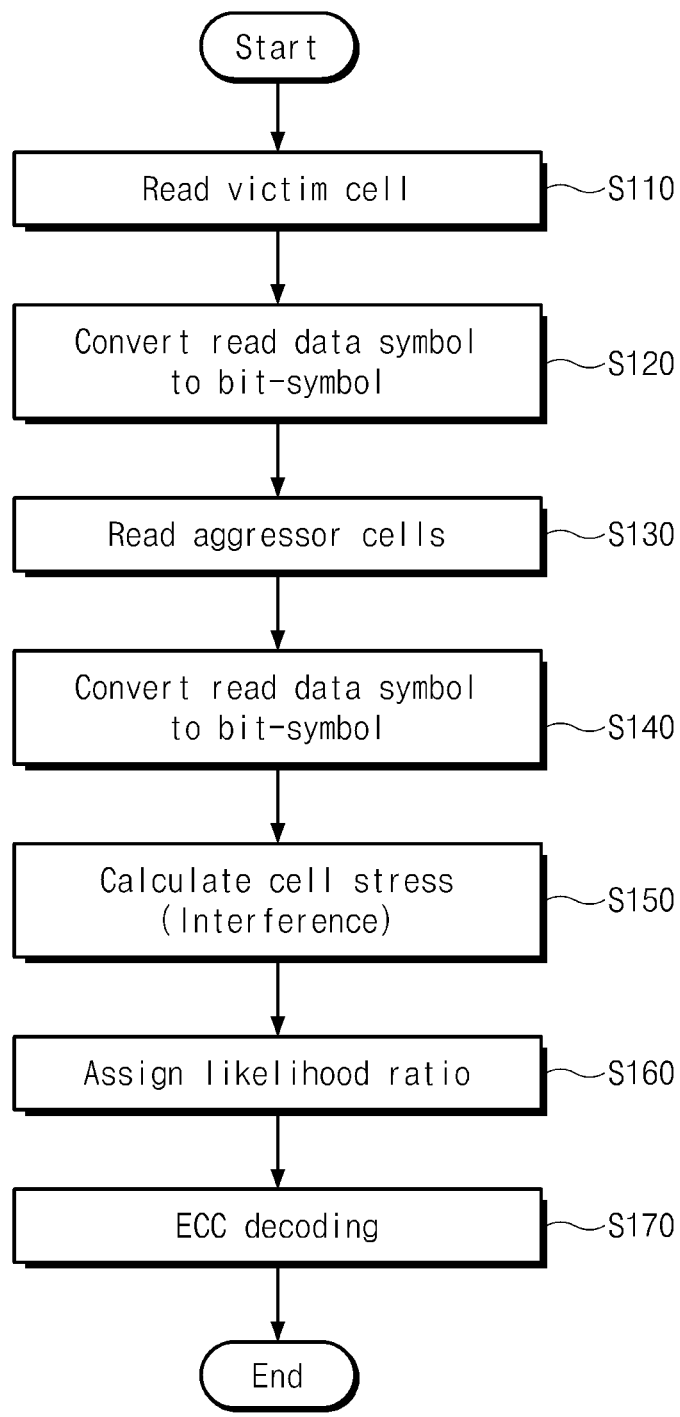
FIG. 16 is a flowchart illustrating a method of determining logical values which are stored in an observation memory cell in the soft decision logic of FIG. 8 according to exemplary embodiments of the present general inventive concept.

FIG. 16 is a flowchart illustrating a method of determining logical values which are stored in an observation memory cell in the soft decision logic 800 of FIG. 8 according to exemplary embodiments of the present general inventive concept.

Referring to FIGS. 8 and 16, the first data buffer unit 810 can receive the data of the memory cells of a selected word line that are read through an i-bit fractional reading scheme in operation S110. When it is assumed that the first data buffer unit 810 receives data by one page units, the first data buffer unit 810 may receive data a maximum of $(2^i)-1$ times. A $(2^i)-1$ number of data corresponding to one memory cell can configure and/or determine a read data symbol.

The read data symbol stored in the first data buffer unit 810 can be converted into a bit symbol in operation S120.

The second data buffer unit 820 can receive the data of the memory cells of an unselected word line adjacent to the selected word line that are read through the i-bit fractional reading scheme in operation S130. The first data buffer unit 810 can receive the data of the memory cells of the selected word line that are read through the i-bit fractional reading scheme.

When it is assumed that the soft logic 630 receives data by one page units (i.e., data is received in predetermined page sizes), the first data buffer unit 810 may receive data a maximum of $(2^i)-1$ times. A $(2^i)-1$ number of data corresponding to one memory cell configure a read data symbol.

Referring to FIG. 9, interference memory cells adjacent to an observation memory cell may share a word line with the observation memory cell. The interference memory cells adjacent to the observation memory cell may not share a word line with the observation memory cell. In a NAND flash memory where a reading operation is performed in page units, therefore, operation S110 of reading the observation memory cell and operation of reading an interference memory cell sharing a word line with the observation memory cell may be simultaneously performed. In exemplary embodiments of the present general inventive concept, operation S110 of reading the observation memory cell and operation of reading interference memory cells not sharing a word line with the observation memory cell may not be performed simultaneously.

The read data symbol stored in the first data buffer unit 810 can be converted into a bit symbol in operation S140.

On the basis of the bit symbol calculated in operation S120 and the bit symbol calculated in operation S140, the interference calculation unit 850 can calculate interference that the observation memory cell receives from the interference memory cells in operation S150. As described above with reference to FIGS. 7 and 8, the interference calculation unit 850 can calculate interference on the basis of the threshold voltages of the interference memory cells, the directions of the interference memory cells, and distances between the interference memory cells.

On the basis of the bit symbol calculated in operation S120 and the interference calculated in operation S150, the likelihood ratio calculation unit 860 can calculate a likelihood ratio in operation S160. For example, the likelihood ratio calculation unit 860 may calculate a logarithmic likelihood ratio on the basis of a bit symbol and interference. Exemplarily, the likelihood ratio calculation unit 860 may calculate a likelihood ratio on the basis of information for the threshold voltage dispersions of memory cells stored. As an example, the likelihood ratio calculation unit 860 may store the threshold voltage dispersions of memory cells based on interference and calculate a likelihood ratio using the threshold voltage dispersions. Exemplarily, the likelihood ratio calculation unit 860 may calculate likelihood ratios for the first and second states S1 and S2 (see FIG. 3) of a bit symbol on the basis of information stored, respectively.

Based on the likelihood ratio that has been calculated in operation S160, the ECC decoder 870 can determine a logical value stored in the observation memory cell in operation S170. For example, the ECC decoder 870 compares likelihood ratios for the first and second states S1 and S2 (see FIG. 3) to select a state corresponding to the maximum likelihood ratio. The logical value determined by the ECC decoder 870 may be provided as a read data that a host requests.

Figure 17:
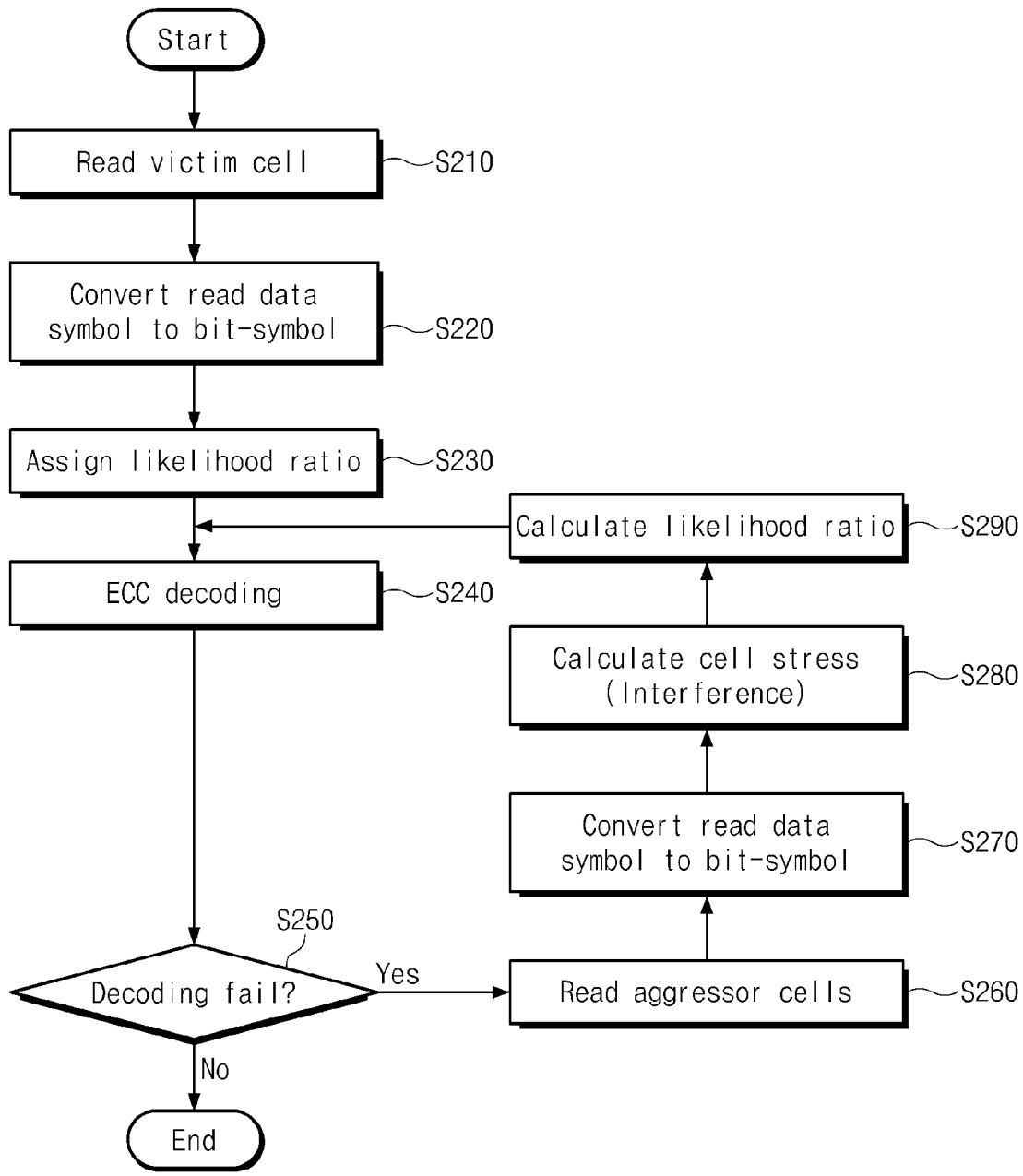
FIG. 17 is a flowchart illustrating a method of determining logical values which are stored in an observation memory cell in the soft decision logic of FIG. 8 according to exemplary embodiments of the present general inventive concept.

FIG. 17 is a flowchart illustrating a method of determining logical values which are stored in an observation memory cell in the soft decision logic 800 of FIG. 8 according to exemplary embodiments of the present general inventive concept.

Referring to FIGS. 8 and 17, the first data buffer unit 810 can receive the data of the memory cells of a selected word line that are read through an i-bit fractional reading scheme in operation S210. A maximum of $(2^i)-1$ data corresponding to one memory cell can configure a read data symbol.

The read data symbol stored in the first data buffer unit 810 can be converted into a bit symbol in operation S220. That is, operations S210 and S220 are as described above with reference to the first data buffer 810 and its operation as illustrated in FIGS. 8 and 10.

On the basis of the bit symbol calculated in operation S220, the likelihood ratio calculation unit 860 can calculate a likelihood ratio in operation S230. For example, the likelihood ratio calculation unit 860 may calculate a logarithmic likelihood ratio on the basis of a bit symbol and interference. For example, the likelihood ratio calculation unit 860 can calculate likelihood ratios for the first and second states S1 and S2 (see FIG. 3) of a converted bit symbol, respectively. Exemplarily, the likelihood ratio calculation unit 860 may calculate the likelihood ratios for the first and second states S1 and S2 (see FIG. 3) of the bit symbol on the basis of information for the threshold voltage dispersions stored, respectively. The likelihood ratio calculation unit 860 may calculate a likelihood ratio that is not based on the interference of interference memory cells.

Based on the likelihood ratio that has been calculated in operation S230, the ECC decoder 870 can determine a logical value stored in the observation memory cell in operation S240. For example, the ECC decoder 870 can compare likelihood ratios for the first and second states S1 and S2 (see FIG. 3) to select a state corresponding to the maximum likelihood ratio. The ECC decoder 870 may detect and correct a read error.

The ECC decoder 870 can determine whether a bit error may be corrected in operation S250. That is, operation S250 may determine whether there is a decoding failure (i.e., there is no decoding failure when a bit error is correctable, and a decoding failure may occur when the bit error is not correctable).

When an error is corrected, the soft decision operation and ECC decoding of a selected word line are completed.

When ECC decoding is failed in operation S250, operation S260 can be performed to read aggressor memory cells. The second data buffer unit can receive the data of the memory cells of an unselected word line adjacent to the selected word line in operation S260. Operation S260 can be similarly performed like operation S130 that has been described above with reference to FIG. 10. That is, received data can configure a read data symbol.

Referring to FIG. 9, interference memory cells adjacent to an observation memory cell may share a word line with the observation memory cell. The interference memory cells adjacent to the observation memory cell may not share a word line with the observation memory cell. In a NAND flash memory where a reading operation is performed in page units, therefore, operation S210 of FIG. 17 of reading the observation memory cell and operation of reading an interference memory cell sharing a word line with the observation memory cell may be simultaneously performed. In exemplary embodiments of the present general inventive concept, operation S210 of reading the observation memory cell and an operation of reading interference memory cells not sharing a word line with the observation memory cell may not be performed simultaneously.

The second bit symbol converter 840 can convert the read data symbols of the interference memory cells into bit symbols in operation S270 of FIG. 17.

The interference calculation unit 850 can compare the bit symbol calculated in operation S220 and the bit symbol calculated in operation S270 to calculate the interference the observation memory cell receives from the interference memory cells in operation S280. As described above with reference to FIGS. 7 and 8, the interference calculation unit 850 can calculate interference on the basis of the threshold voltages of the interference memory cells, the directions of the interference memory cells, and distances between the interference memory cells.

On the basis of the bit symbol calculated in operation S220 and the interference calculated in operation S280, the likelihood ratio calculation unit 860 can calculate a likelihood ratio in operation S290. For example, the likelihood ratio calculation unit 860 may calculate a logarithmic likelihood ratio on the basis of a bit symbol and interference. Exemplarily, the likelihood ratio calculation unit 860 may store the threshold voltage dispersions of memory cells based on interference and calculate a likelihood ratio using the threshold voltage dispersions. Exemplarily, the likelihood ratio calculation unit 860 may calculate likelihood ratios for the first and second states S1 and S2 (see FIG. 3) of a bit symbol on the basis of information stored, respectively.

Based on the likelihood ratio that has again been calculated in operation S290, the ECC decoder 870 can determine a logical value stored in the observation memory cell in operation S170 illustrated in FIG. 10 and described above. For example, the ECC decoder 870 can compare likelihood ratios for the first and second states S1 and S2 (see FIG. 3) to select a state corresponding to the maximum likelihood ratio. The ECC decoder 870 can detect and correct at least one bit error based on the again-calculated likelihood ratio in operation S240.

Figure 18:
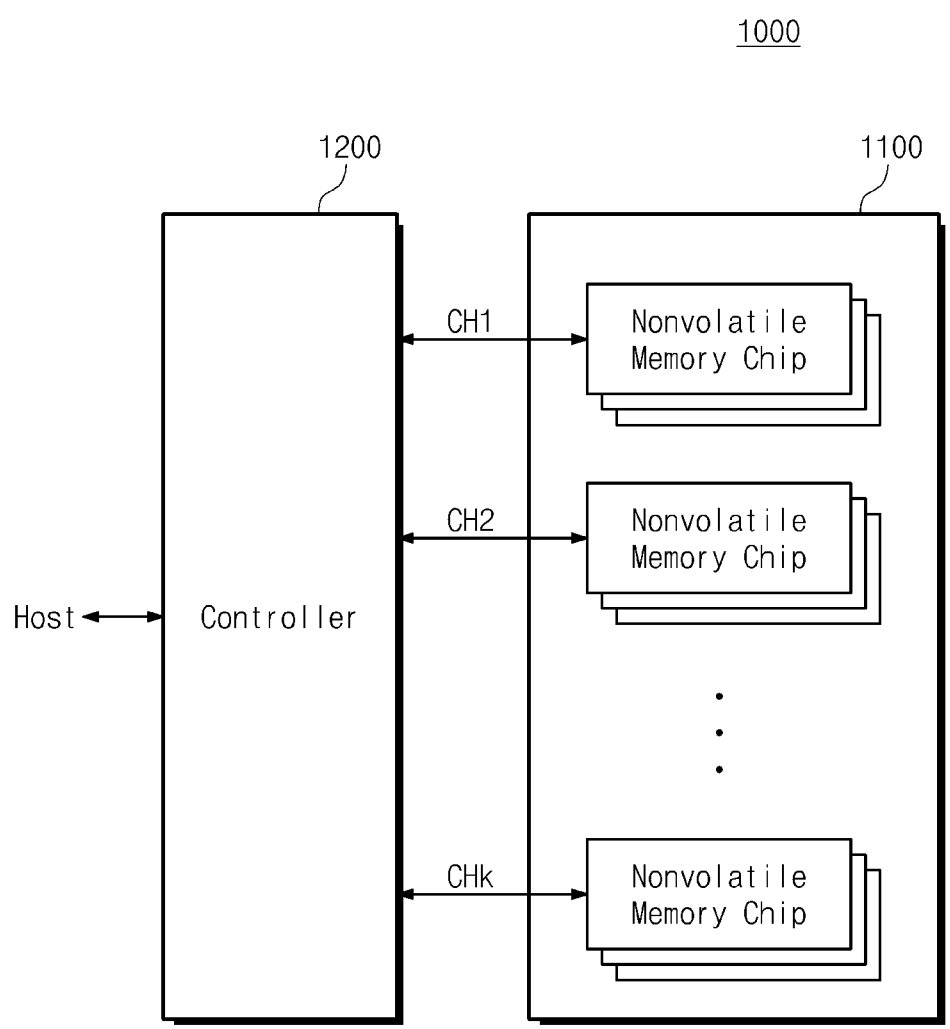
FIG. 18 is a block diagram illustrating an application example of the memory system of FIG. 6 according to exemplary embodiments of the present general inventive concept.

FIG. 18 is a block diagram illustrating an application example of the memory system 600 of FIG. 6.

A controller 1200 of the memory system 1000 may be similar to and/or the same as the controller 620 illustrated in FIG. 7 and described above.

Referring to FIG. 18, the memory system 1000 according to exemplary embodiments of the present general inventive concept can include a nonvolatile memory device 1100 and a controller 1200. The nonvolatile memory device 1100 includes a plurality of nonvolatile memory chips. The plurality of nonvolatile memory chips can be divided into a plurality of groups. The respective groups of the nonvolatile memory chips can communicate with the controller 1200 through at least one common channel. The controller 1200 may be a processor, field programmable gate array, programmable logic device, application specific integrate circuit, and/or any other suitable controller to carry out the exemplary embodiments of the present general inventive concept. The controller 1200 may include one or more interfaces to communicate with the nonvolatile memory device 1100 and/or a host.

In FIG. 8, it is illustrated that the nonvolatile memory chips can communicate with the controller 1200 through first to kth channels CH1 to CHk. Each of the nonvolatile memory chips can be similar to an/or the same as the nonvolatile memory device that has been described above with reference to FIGS. 1 and 2. The controller 1200 can be similar to and/or the same as the controller 620 that has been described above with reference to FIG. 7.

Figure 19:
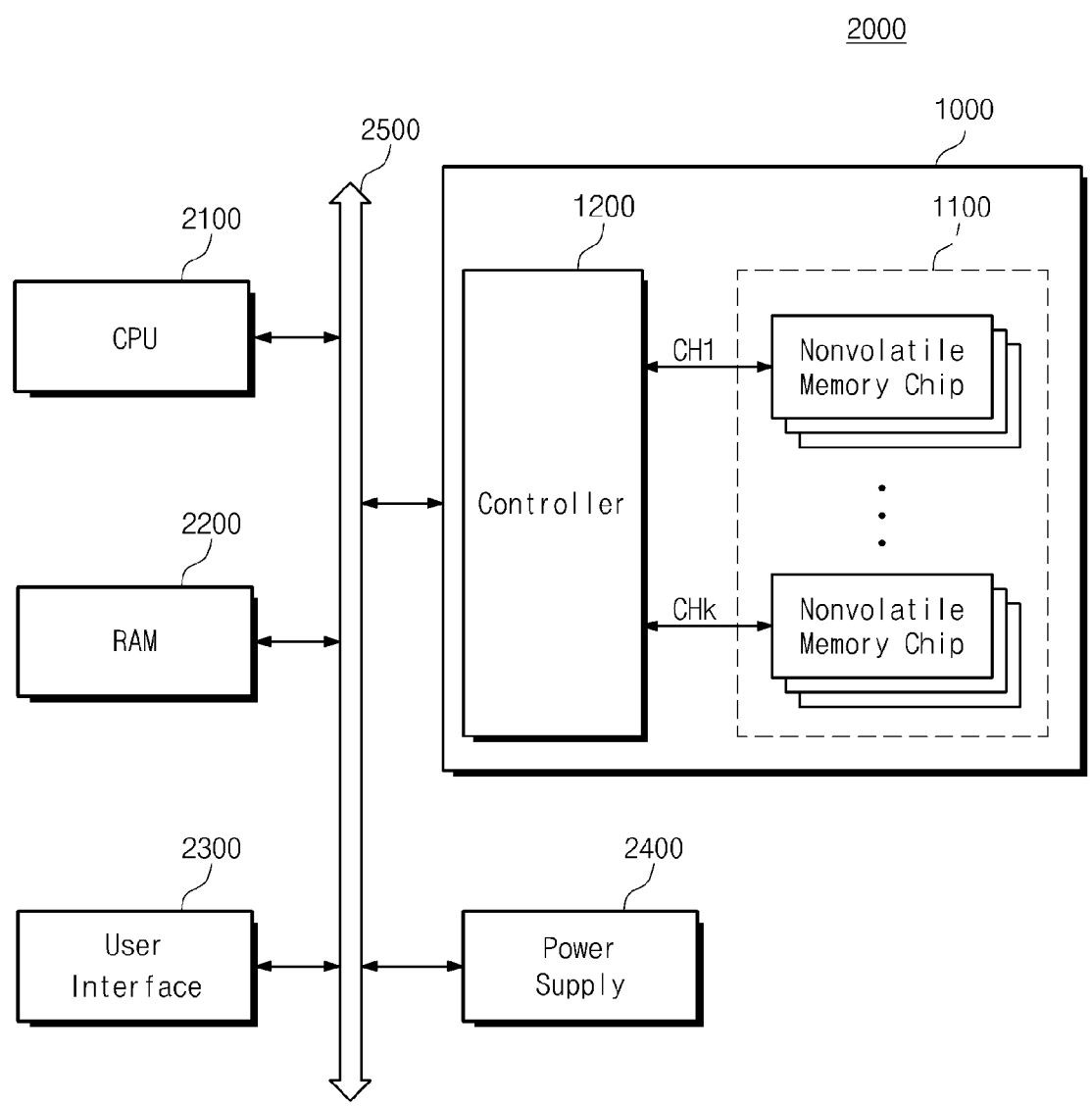
FIG. 19 is a block diagram illustrating a computing system 2000 including a memory system according to exemplary embodiments of the present general inventive concept.

FIG. 19 is a block diagram illustrating a computing system 2000 including the memory system 1000 which has been described above with reference to FIG. 18.

Referring to FIG. 19, the computing system 200 according to exemplary embodiments of the present general inventive concept can include a Central Processing Unit (CPU) 2100, a Random Access Memory (RAM) 2200, a user interface 2300, a power supply 2400, and the memory system 1000. The user interface 2300 may include one or more input devices and a display to receive one or more selections from a user. The power supply 2400 may provide electrical power to one or more of the CPU 2100, RAM 2200, the user interface 2300, and the memory system 1000.

The memory system 1000 can be communicatively connected to the CPU 2100, the RAM 2200, the user interface 2300 and the power supply 2400 through a system bus 2500. Data that are provided through the user interface 2300 or processed by the CPU 2100 can be stored in the memory system 1000. The memory system 1000 can include the controller 1200 and the nonvolatile memory device 1100.

In FIG. 19, it is illustrated that the nonvolatile memory device 1100 is communicatively connected to the system bus 2500 through the controller 1200. However, the nonvolatile memory device 1100 may be directly connected to the system bus 2500. The functions and/or operations of the controllers 620 and 1200 that have been respectively described above with reference to FIGS. 6 and 18 can be performed by the CPU 2100.

In FIG. 19, the memory system 1000 that has been described above with reference to FIG. 18 is illustrated may be provided with the computing system 2000. However, the memory system 1000 may be replaced by the memory system 600 that has been described above with reference to FIG. 6.

Exemplarily, the computing system 2000 may include all the memory systems 600 and 1000 that have been respectively described above with reference to FIGS. 6 and 18.

Interferences that the observation memory cell receives from the interference memory cells can differ by memory cells. According to exemplary embodiments of the present general inventive concept, threshold voltage dispersions corresponding to respective memory cells can be separately considered. An accurate likelihood ratio can be calculated using the separately-considered threshold voltage dispersions. Therefore, an error correcting function can be improved, and the reliability of data stored in the memory cells can be enhanced and/or increased.

According to exemplary embodiments of the present general inventive concept, an accurate likelihood ratio can be calculated using the threshold voltage dispersion that is separately considered for each memory cell, and the logical value of the memory cell can be determined. Accordingly, the memory system and the operating method thereof can increase and/or enhance the reliability of data stored in the memory cell.

The present general inventive concept can also be embodied as computer-readable codes on a computer-readable medium. The computer-readable medium can include a computer-readable recording medium and a computer-readable transmission medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network coupled computer systems so that the computer-readable code is stored and executed in a distributed fashion. The computer-readable transmission medium can be transmitted through carrier waves or signals (e.g., wired or wireless data transmission through the Internet). Also, functional programs, codes, and code segments to accomplish the present general inventive concept can be easily construed by programmers skilled in the art to which the present general inventive concept pertains.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

Although several embodiments of the present invention have been illustrated and described, it would be appreciated by those skilled in the art that changes may be made in these embodiments without departing from the principles and spirit of the general inventive concept, the scope of which is defined in the claims and their equivalents.

What is claimed is:

1. An operating method of a memory system including a nonvolatile memory device, the operating method comprising:
reading data from a plurality of memory cells connected to a selected word line through a plurality of read operations using different read voltages to configure read data symbols, the read data symbols comprising a first read data symbol in correspondence to an observation cell and a second read data symbol in correspondence to an interference cell;
identifying the interference cell of the observation memory cell of the plurality of memory cells using permutation information; and
determining a logical value of the observation memory cell by referring to the first read data symbol and the second read data symbol of the interference cell.

2. The operating method of claim 1, wherein the permutation information is generated in response to a physical bit arrangement of the data as stored in the plurality of memory cells.

3. The operating method of claim 2, wherein the permutation information is generated based on an I/O coding method of the nonvolatile memory device.

4. The operating method of claim 2, wherein the determining the logical value of the observation memory cell comprises:
converting the first data read symbol into a first bit symbol;
converting the second read data symbol into a second bit symbol; and
determining the logical value of the observation memory cell by referring to the first bit symbol and the second bit symbol of the interference cell,
wherein the length of each of the first and the second bit symbols is less than that of each of the first and the second read data symbols.

5. The operating method of claim 4, wherein the determining the logical value of the observation memory cell further comprises:
calculating a likelihood ratio according to at least the first bit symbol and the second bit symbol of the interference cell; and
determining the logical value of the observation memory cell according to at least the calculated likelihood ratio.

6. The operating method of claim 5, wherein the determining the logical value of the observation memory cell further comprises decoding the first bit symbol with the calculated likelihood ratio using ECC engine.

7. A memory system comprising:
a nonvolatile memory device having an observation memory cell and a plurality of interference memory cells adjacent to the observation memory cell; and
a controller to control the nonvolatile memory device, wherein:
the nonvolatile memory device includes a reading/writing circuit to read the observation memory cell and the interference memory cells at least one time with different read voltages, and
the controller comprises:
a data buffer unit to store a first read data symbol which is configured with data read from the observation memory cell and second read data symbols which are respectively configured with data read from the interference memory cells;
a permutation unit to generate permutation information in response to a physical bit arrangement of data stored in the observation memory cell and the interference memory cells; and
a determination unit to determine a logical value of the observation memory cell, based on the first read data symbol and the second read data symbols of the interference memory cells by referring to the permutation information.

8. The memory system of claim 7, wherein the permutation unit generates the permutation information in response to arrangement data from the nonvolatile memory device.

9. The memory system of claim 7, wherein the permutation unit generates the permutation information in response to arrangement data stored in the controller.

10. The memory system of claim 7, wherein the determination unit comprises:
a first bit symbol converter to receive the first read data symbol stored in the data buffer unit, and to convert the first read data symbol into a first bit symbol; and
a second bit symbol converter to receive the second read data symbols stored in the data buffer unit, and to convert the second read data symbols into second bit symbols, and
wherein the determination unit is configured to identify the interference memory cells of the observation memory cell using the permutation information and to determine the logical value of the observation memory cell by referring to the first bit symbol and the second bit symbols of the interference memory cells.

11. The memory system of claim 10, wherein the determination unit is configured to calculate a likelihood ratio according to at least the first bit symbol and the second bit symbol of the interference memory cells, and is configured to determine the logical value of the observation memory cell according to at least the calculated likelihood ratio.

12. The memory system of claim 11, wherein the determination unit is configured to decode the first bit symbol with the calculated likelihood ratio using ECC engine.

13. The memory system of claim 7, wherein the nonvolatile memory device comprises a control logic configured to generate arrangement data in response to the physical bit arrangement of the data stored in the observation memory cell and the interference memory cells, and the permutation unit configured to generate the permutation information in response to the arrangement data from the nonvolatile memory device.

14. An operating method of a memory system including a nonvolatile memory device and a controller, the operating method comprising:
reading data from a plurality of memory cells connected to an unselected word line adjacent to a selected word line, through a plurality of read operations using different read voltages in the nonvolatile memory device;
cooking the read data, from the plurality of memory cells to identify at least one memory cell, as aggression data which is programmed in a predetermined state in response to the read data in the nonvolatile memory device;
outputting the cooked data including the aggression data to the controller;
outputting read data from the selected word line to the controller; and
determining the logical value of the read data from the selected word line by referring to the aggression data.

15. The operating method of claim 14, wherein the predetermined state includes at least one of programming states having higher threshold voltage than a predetermined threshold voltage.

16. The operating method of claim 14, wherein the plurality of read operations using different read voltages in the nonvolatile memory device comprises:
reading data from the plurality of memory through first and second read operation using first and second read voltage to configure first and second data bit, and
the cooking the read data comprises:
executing exclusive OR operation between the first and the second data bit.

17. The operating method of claim 14, further comprising reading a data from the observation memory cell connected to the selected word line through a plurality of read operations using different read voltages to configure a read data symbol, and
determining the logical value of the observation memory cell referring to the read data symbol and the aggression data.

18. The operating method of 17, further comprising:
determining an interference of the observation memory cell referring to the aggression data; and
calculating a likelihood ratio referring to the interference and the read data symbol,
wherein determining the logical value of an observation memory cell comprises determining the logical value of the observation memory cell according to the calculated likelihood ratio.

19. A nonvolatile memory device having an observation memory cell connected to a selected word line and an interference memory cell connected to the unselected word line adjacent to the selected world line, comprising:
a reading/writing circuit configured to read the observation memory cell and the interference memory cell; and
an aggression data generating unit configured to control the reading/writing circuit to identify a memory cell which is programmed in a predetermined state in response to the read data from the interference memory cell, and to cook read data from the plurality of memory cells as aggression data referring to the identified memory cell.

20. The nonvolatile memory device of claim 19, wherein the predetermined state is a most significant programming state.

* * * * *